United States Patent
Zhou

(10) Patent No.: US 9,612,307 B2
(45) Date of Patent: Apr. 4, 2017

(54) REDUCING ARTIFACTS IN MAGNETIC RESONANCE IMAGES ACQUIRED USING PROPELLER ECHO PLANAR IMAGING

(75) Inventor: Xiaohong Joe Zhou, Naperville, IL (US)

(73) Assignee: THE BOARD OF TRUSTEES OF THE UNIVERSITY OF ILLINOIS, Urbana, IL (US)

( * ) Notice: Subject to any disclaimer, the term of this patent is extended or adjusted under 35 U.S.C. 154(b) by 805 days.

(21) Appl. No.: 14/113,044

(22) PCT Filed: Apr. 23, 2012

(86) PCT No.: PCT/US2012/034689
§ 371 (c)(1),
(2), (4) Date: Jan. 6, 2014

(87) PCT Pub. No.: WO2012/145754
PCT Pub. Date: Oct. 26, 2012

(65) Prior Publication Data
US 2014/0111203 A1    Apr. 24, 2014

Related U.S. Application Data

(60) Provisional application No. 61/477,806, filed on Apr. 21, 2011.

(51) Int. Cl.
*G01R 33/565* (2006.01)
*G01R 33/48* (2006.01)
*G01R 33/561* (2006.01)

(52) U.S. Cl.
CPC ....... *G01R 33/565* (2013.01); *G01R 33/4824* (2013.01); *G01R 33/56518* (2013.01);
(Continued)

(58) Field of Classification Search
CPC .......... G01R 33/5616; G01R 33/56572; G01R 33/56554; G01R 33/56518; G01R 33/4824; G01R 33/565
See application file for complete search history.

(56) References Cited

U.S. PATENT DOCUMENTS 5,672,969 A    9/1997    Zhou et al.
6,114,852 A    9/2000    Zhou et al.
(Continued)

OTHER PUBLICATIONS

Rangwala et al., "An Efficient Correction Technique for Constant, Linear and 'Oblique' Phase Errors in EPI-PROPELLER," Proceedings of the International Society for Magnetic Resonance in Medicine, 18th Scientific Meeting an Exhibition, Stockholm, Sweden, May 1-7, 2010, vol. 18, Apr. 17, 2010, p. 3100.
(Continued)

*Primary Examiner* — Gregory H Curran
(74) *Attorney, Agent, or Firm* — McDonnell Boehnen Hulbert & Berghoff LLP

(57) ABSTRACT

In PROPELLER utilizing EPI k-space sampling, phase errors arising primarily from eddy currents can considerably degrade image quality. The phase errors include spatially constant phase errors, spatially linear phase errors, and oblique phase errors. Methods to measure and correct for these phase errors are disclosed. Two or three reference scans are acquired, each reference scan being mutually orthogonal along the orthogonal physical gradient axes in a MRI system. A spatially constant phase error and a spatially linear phase error are determined from each of the reference scans for each relevant physical gradient axis. These phase errors can be used to predict the constant, linear, and oblique phase errors in each blade of an EPI PROPELLER k-space data set. With the known phase errors for each blade, constant, linear, and/or oblique phase correction is applied
(Continued)

prior to or during PROPELLER image reconstruction, producing an image with substantially reduced artifacts.

12 Claims, 15 Drawing Sheets

(52) U.S. Cl.
CPC . *G01R 33/56554* (2013.01); *G01R 33/56572* (2013.01); *G01R 33/5616* (2013.01)

(56) References Cited

U.S. PATENT DOCUMENTS

| | | | | |
|---|---|---|---|---|
| 6,188,219 | B1* | 2/2001 | Reeder | G01R 33/58 324/307 |
| 2006/0264735 | A1 | 11/2006 | Stemmer | |
| 2007/0085538 | A1 | 4/2007 | Hinks et al. | |
| 2010/0117645 | A1 | 5/2010 | Eggers et al. | |

OTHER PUBLICATIONS

Rangwala et al., "A Generalized Phase Correction Technique for EPI-PROPELLER," Proceedings of the International Society for Magnetic Resonance in medicine, 19th Annual Meeting and Exhibition, Montreal, Quebec, May 7-13, 2011, vol. 19, Apr. 23, 2011, p. 4613.

Hoge et al., "Robust EPI Nyquist ghost elimination via spatial and temporal encoding," Magnetic Resonance in Medicine, vol. 64, No. 6, Jul. 27, 2010, pp. 1791-1791.

Chang et al., "Comparison of applying 1D phase and 2D phase N/2 ghost correction prior to PROPELLER-EPI reconstruction," Proceedings of the international Society for Magnetic Resonance in Medicine, 18th Scientific Meeting and Exhibition, Stockholm, Sweden, May 1-7, 2010, vol. 18, Apr. 17, 2010, p. 5061.

Nan-Kuei Chen et al., "Removal of EPI Nyquist ghost artifacts with two-dimensional phase correction," Magnetic Resonance in medicine, vol. 51, No. 6, Jan. 1, 2004, pp. 1247-1253.

Schmithorst et al., "Simultaneous Correction of Ghost and Geometric Distortion Artifacts in EPI Using a Multiecho Reference Scan," IEEE Transactions on medical Imaging, IEEE Service Center, Piscataway, NJ, US, vol. 20, No. 5, May 1, 2001.

Ahn et al., "New Phase Correction Method in NMR Imaging Based on Autocorrelation and Histogram Analysis," IEEE Transactions on medical Imaging, IEEE Service Center, Piscataway, NJ, US, vol. MI-06, No. 1, Mar. 1, 1987, pp. 32-36.

Pipe et al., "Turboprop: Improved Propeller imaging," Magnetic Resonance in medicine, vol. 55, No. 2, Feb. 1, 2006, pp. 380-385.

* cited by examiner

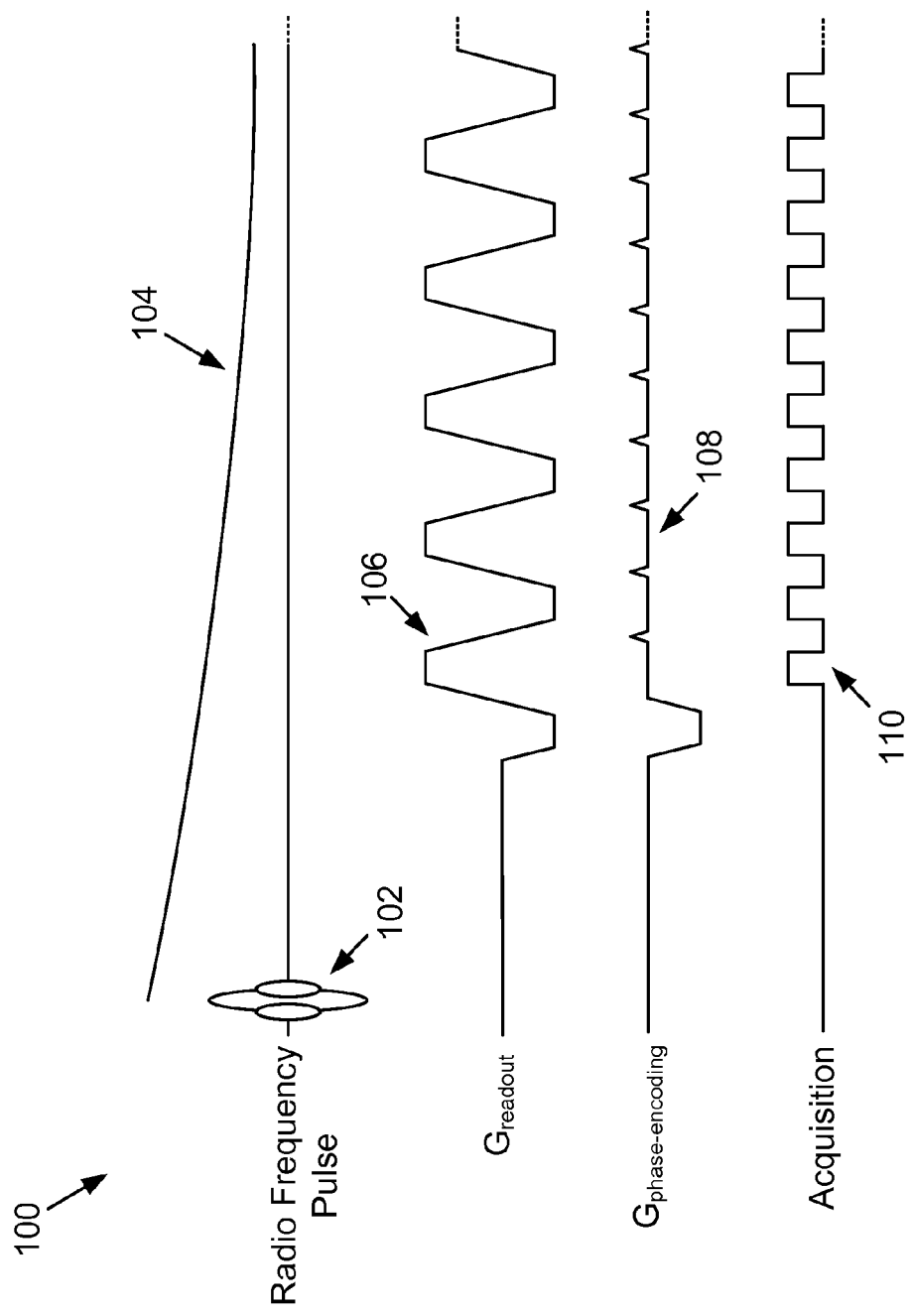

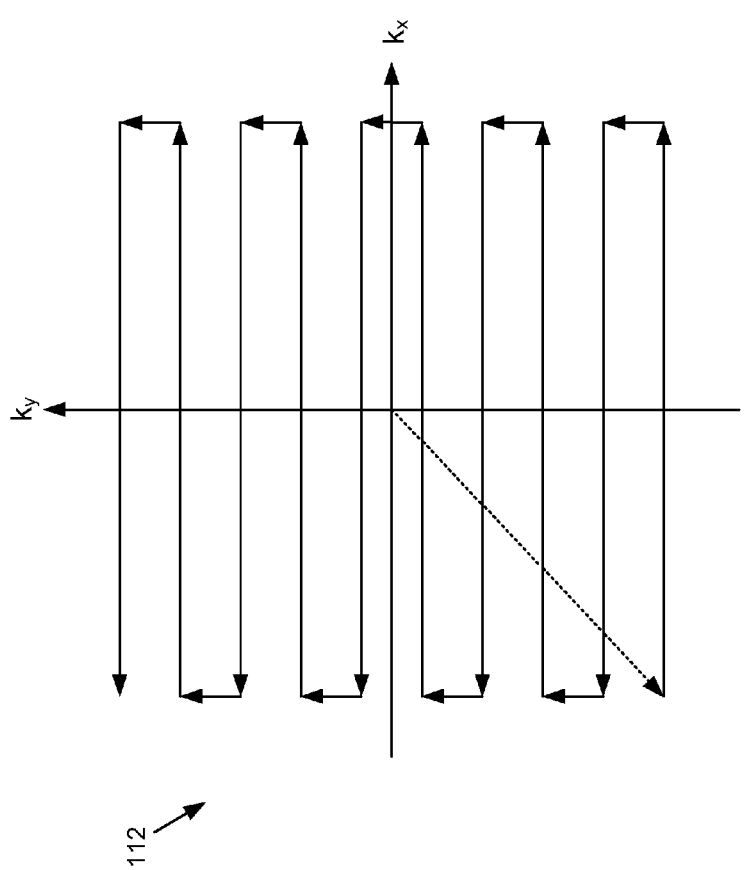

300

302 — Determining a constant phase error associated with a first axis and a linear phase error along the first axis, based on a first reference scan of an object in an MRI system, the first reference scan being acquired using a first reference readout gradient along the first axis

304 — Determining a constant phase error associated with a second axis and a linear phase error along the second axis, based on a second reference scan of the object, the second reference scan being acquired using a second reference readout gradient along the second axis, the second axis being orthogonal to the first axis

306 — Determining a constant phase error associated with a third axis and a linear phase error along the third axis, based on a third reference scan of the object, the third reference scan being acquired using a third reference readout gradient along the third axis, the third axis being orthogonal to the first axis and the second axis

308 — Receiving a plurality of intersecting blades in an imaging plane of k-space

310 — For each of the plurality of intersecting blades, determining a constant phase error, a linear phase error, and an oblique phase error

312 — Displaying an image, wherein the image is generated based on at least one of the constant phase error, the linear phase error, and the oblique phase error

┌─────────────────────────────────────────────────────────┐
│ Acquiring a plurality of reference scans of an object in an MRI, wherein │
│ acquiring the plurality of reference scans comprises applying a first │
│ reference readout gradient along a first axis of a plurality of orthogonal │
│ axes, and applying a second reference readout gradient along a second │
│ axis of the plurality of orthogonal axes │
└─────────────────────────────────────────────────────────┘
402

┌─────────────────────────────────────────────────────────┐
│ Based on the plurality of reference scans, determining a plurality of │
│ constant phase errors associated with corresponding axes of the plurality of │
│ orthogonal axes and determining a plurality of linear phase errors along │
│ corresponding axes of the plurality of orthogonal axes │
└─────────────────────────────────────────────────────────┘
404

┌─────────────────────────────────────────────────────────┐
│ Acquiring a plurality of intersecting blades in an imaging plane of k-space │
└─────────────────────────────────────────────────────────┘
406

┌─────────────────────────────────────────────────────────┐
│ For each of the plurality of intersecting blades, determining a constant │
│ phase error, a linear phase error, and an oblique phase error │
└─────────────────────────────────────────────────────────┘
408

┌─────────────────────────────────────────────────────────┐
│ Displaying an image, wherein the image is generated based on at least one │
│ of the constant phase error, the linear phase error, and the oblique phase │
│ error │
└─────────────────────────────────────────────────────────┘
410

Figure 4

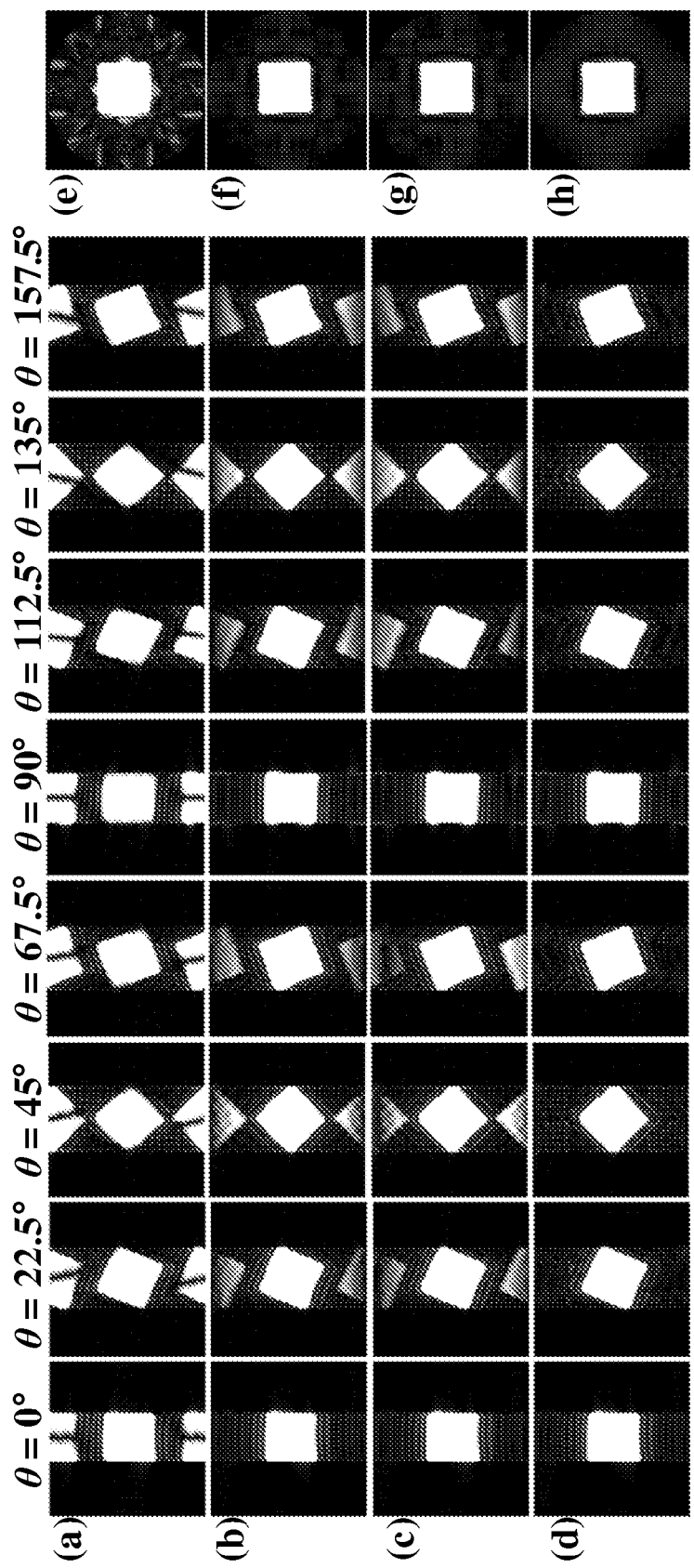

REDUCING ARTIFACTS IN MAGNETIC RESONANCE IMAGES ACQUIRED USING PROPELLER ECHO PLANAR IMAGING

CROSS-REFERENCE TO RELATED APPLICATIONS

This application claims the benefit of priority to U.S. Provisional Patent Application Ser. No. 61/477,806, filed Apr. 21, 2011, the contents of which are hereby incorporated by reference.

BACKGROUND

Magnetic resonance imaging (MRI) is commonly used to image internal tissues of a subject. MRI is typically performed by placing the subject to be imaged at or near the isocenter of a strong, uniform magnetic field known as the main magnetic field $B_0$. The main magnetic field $B_0$ results in magnetization of the atomic nuclei that are aligned with the main magnetic field $B_0$.

Thereafter, a radio frequency (RF) pulse is applied to the subject. The RF pulse can cause the magnetization of the atomic nuclei to nutate away from the direction of the main magnetic field $B_0$. After the RF pulse is switched off, the magnetization of the atomic nuclei precesses about the main magnetic field $B_0$ while returning to an equilibrium state (i.e., to be aligned with the main magnetic field $B_0$), causing emission of RF radiation at a characteristic frequency. The emitted RF radiation can be detected and analyzed to yield information that can be used to produce an image of the subject.

To form an image, magnetic field gradients are also applied to the subject in addition to the main magnetic field $B_0$ and the RF radiation. The magnetic field gradients are typically applied along one or more orthogonal axes (x, y, z), the z-axis usually being aligned with the main magnetic field $B_0$, and introduce spatially distributed variations in frequency or phase of the precessing nuclear spins. By applying the RF radiation and the magnetic field gradients in carefully devised pulses and/or sequences of pulses that are switched on and off, the RF radiation emitted can be encoded with spatial information that, when detected and analyzed, can be used to construct detailed images of the subject or object. Various techniques utilizing both specific pulse sequences and advanced data analysis and imaging methods have been developed, providing new advances, as well as introducing new challenges.

An example of a pulse sequence is echo planar imaging (EPI). FIG. 1A illustrates an example of an EPI pulse sequence 100 utilizing a single RF pulse 102. As shown, the RF pulse 102 is applied to an object in an MRI system, resulting in transverse magnetization 104 of the atomic nuclei that decays over time. During decay of the transverse magnetization 104, a readout gradient 106 is applied to the object. As shown in FIG. 1A, the readout gradient 106 includes a pre-phasing lobe followed by a number of readout lobes with alternating polarity. The readout gradient 106 can be applied to the object along a first axis, such as, for example, the x-axis.

Additionally, a phase-encoding gradient 108 is applied to the object. As shown, the phase-encoding gradient 108 includes a pre-phasing lobe followed by a number of blips, with each of the blips having the same polarity and equal area. The phase-encoding gradient 108 can alternatively include a pre-phasing lobe and a small constant gradient concurrent with a train of readout gradient lobes 106. The phase encoding gradient 108 can be applied to the object along a second axis, such as, for example, the y-axis, which is orthogonal to the first axis.

While the readout gradient 106 and the phase-encoding gradient 108 are applied to the object, RF radiation emitted by the object can be sampled according to the acquisition 110. The sampled RF emission can be used to generate k-space data, which can be further processed to produce an image.

FIG. 1B illustrates k-space data 112 corresponding to the EPI pulse sequence 100 shown in FIG. 1A. In FIG. 1B, the $k_x$ axis of k-space corresponds to the axis along which the readout gradient 106 was applied, while the $k_y$ axis of k-space corresponds to the axis along which the phase-encoding gradient 108 was applied. The bottom horizontal line of k-space data corresponds to the first readout lobe of the readout gradient 106 shown in FIG. 1A. As shown in FIG. 1B, the bottom horizontal line points towards the positive $k_x$ values because the first readout lobe, shown in FIG. 1A, has a positive polarity. The first vertical line at the lower-right corner of FIG. 1B corresponds to the first blip of the phase-encoding gradient 108 and points towards the positive $k_y$ values because the first blip has a positive polarity, as shown in FIG. 1A. The next horizontal line of k-space data corresponds to the second readout lobe of the readout gradient 106 and points towards the negative $k_x$ values because the second readout lobe has a negative polarity, as shown in FIG. 1A. The additional k-space data corresponds to the readout gradient 106 and the phase-encoding gradient 108 in a similar manner. In implementations in which the phase-encoding gradient 108 includes a pre-phasing lobe and a small constant gradient concurrent with the train of readout gradient lobes, the vertical lines of k-space data cannot be present, resulting in a "zig-zag" of k-space data, attributable to the readout gradient 106 together with the small constant phase-encoding gradient.

The entire k-space data can be acquired using only a single EPI pulse sequence shown in FIG. 1. To achieve a high spatial resolution, however, the EPI pulse sequence is typically repeated multiples times, each sampling a subset of k-space data. Multiple subsets of k-space data are combined, for example, in an interleaved fashion, to accomplish the entire k-space sampling needed to form an image. The method of acquiring multiple subsets of k-space data using EPI is referred to in this disclosure as "multi-shot EPI." Multi-shot EPI can be sensitive to motion of an object in an MRI system, a characteristic associated with artifacts when the method is applied to, for example, a patient. For instance, if the object moves in-between the acquisition of each subset of k-space data, position inconsistency can lead to motion artifacts, potentially degrading image quality. An option for reducing motion artifacts is to arrange the subsets of k-space data as a set of rotating "blades", resulting in over-sampling of a central region of k-space 112. The central region of k-space 112 can be, for example, a circular region that radially extends from the intersection of the $k_x$-axis and the $k_y$-axis.

To this end, a technique called Periodically Rotated Overlapping Parallel Lines with Enhanced Reconstruction (PROPELLER) can be used. According to the PROPELLER technique, k-space data can be acquired in a number of intersecting "blades." FIG. 1C illustrates an example of a blade 114 of k-space data. As shown, the blade 114 includes a number $N_{ro}$ of samplings in a direction of the readout gradient 106 in this example, along the $k_x$ axis as well as a number $N_{pe}$ of lines in a direction of the phase-encoding gradient in this example, along the $k_y$ axis.

Each blade of k-space data can be acquired using an EPI pulse sequence, such as that shown in FIG. 1A. FIG. 1D illustrates three blades $116_1$, $116_2$, and $116_3$ of k-space data. The first blade $116_1$ is offset from the direction of the readout gradient 106 in this example, along the positive direction of the $k_x$ axis—by an angle $\theta_1$, which is not shown in FIG. 1D. The angle $\theta_1$ can be, but need not be, 0°. Further, as shown in FIG. 1D, the second blade $116_2$ is offset from the positive direction of the $k_x$ axis by an angle $\theta_2$. Still further, as shown in FIG. 1D, the third blade $116_3$ is offset from the positive direction of the $k_x$ axis by an angle $\theta_3$.

As shown in FIG. 1D, the blades $116_1$, $116_2$, and $116_3$ intersect in a central region of k-space, allowing for an over-sampling of the central region of k-space. This over-sampling can be used to reduce motion artifacts and, in turn, improve the quality of images of the object.

While the EPI-PROPELLER technique can reduce or eliminate motion artifacts, EPI-PROPELLER can have other shortcomings. For example, EPI-PROPELLER is sensitive to eddy currents, which can result from the rapidly switching polarity of the readout gradient. Eddy currents typically result in spatially constant phase errors and spatially linear phase errors, which appear in images as so-called constant Nyquist ghosts and linear Nyquist ghosts, respectively. In EPI, constant and linear phase errors can be corrected by acquiring reference scans and deriving the constant and linear phase errors from the reference scans to be used for phase correction. However, in EPI-PROPELLER, the constant and linear phase errors must be corrected on a blade-by-blade basis. Thus, in EPI-PROPELLER, the constant and linear phase errors are typically corrected by acquiring reference scans for each blade, and then deriving the constant and linear phase errors for each blade from the reference scans. This process can be time-consuming and inefficient, and can be increasingly time-consuming and inefficient as the number of blades increases.

EPI-PROPELLER can also suffer from oblique phase errors resulting from anisotropy among the gradient axes. In particular, for oblique blades (for example, $\theta_2$ $116_2$, which does not equal 0), the readout gradient and the phase-encoding gradient are produced by combination of multiple physical gradient axes. In these cases, gradient anisotropy among the physical gradient axes can lead to inconsistent k-space shifts along the phase-encoding direction. The shifts are known as oblique phase errors, which result in so-called oblique Nyquist ghosts (ONG). For an example of a technique of reducing oblique Nyquist ghosts, please refer to U.S. Pat. No. 5,672,969 to Zhou et al., titled "Reduction of Nyquist ghost artifacts in oblique echo planar imaging." As with the constant and linear phase errors, the oblique phase errors in EPI-PROPELLER techniques must also be corrected for each blade, typically by measuring the oblique phase errors on a blade-by-blade basis, which can be time-consuming and inefficient.

The art is thus in need of methods and systems for correcting constant, linear, and oblique phase errors in EPI-PROPELLER to efficiently produce MRI images containing fewer artifacts.

OVERVIEW

This disclosure provides, in part, methods and systems for correcting constant, linear, and oblique phase errors in EPI-PROPELLER with the use of two or three reference scans, regardless of the number of blades acquired.

In a first aspect, a method is disclosed that includes acquiring a first reference scan of an object in a magnetic resonance imaging (MRI) system. Acquiring the first reference scan includes applying a first reference readout gradient along a first axis relative to the object to be scanned. The method includes determining a constant phase error $c_x$ associated with the first axis and a linear phase error $l_x$ along the first axis, based on the first reference scan. The method further includes acquiring a second reference scan of the object. Acquiring the second reference scan includes applying a second reference readout gradient along a second axis. The second axis is orthogonal to the first axis. The method includes determining a constant phase error $c_y$ associated with the second axis and a linear phase error $l_y$ along the second axis, based on the second reference scan. The method further includes acquiring a third reference scan of the object. Acquiring the third reference scan includes applying a third reference readout gradient along a third axis. The third axis is orthogonal to the first axis and the second axis. The method includes determining a constant phase error $c_z$ associated with the third axis and a linear phase error $l_z$ along the third axis based on the third reference scan.

The method still further includes acquiring a plurality of intersecting blades about the center of k-space, the plurality of intersecting blades being within the same imaging plane in k-space. Each of the plurality of intersecting blades is offset from the first axis by a respective blade angle $\theta$. The imaging plane is defined by a rotation matrix A given by:

$$A = \begin{bmatrix} a_0 & a_1 & a_2 \\ a_3 & a_4 & a_5 \\ a_6 & a_7 & a_8 \end{bmatrix}.$$

The method includes, for each of the plurality of intersecting blades, determining a constant phase error $c_\theta$, a linear phase error $l_\theta$, and an oblique phase error $o_\theta$ using the phase errors ($c_x$, $l_x$, $c_y$, $l_y$, $c_z$, and $l_z$) measured in two or three reference scans. The constant phase error $c_\theta$ is given by:

$$c_\theta = (a_0 \cos\theta + a_1 \sin\theta)c_x + (a_3 \cos\theta + a_4 \sin\theta)c_y + (a_6 \cos\theta + a_7 \sin\theta)c_z.$$

The linear phase error $l_\theta$ is given by:

$$l_\theta = (a_0 \cos\theta + a_1 \sin\theta)^2 l_x + (a_3 \cos\theta + a_4 \sin\theta)^2 l_y + (a_6 \cos\theta + a_7 \sin\theta)^2 l_z.$$

The oblique phase error $o_\theta$ is given by:

$$o_\theta = \frac{FOV_{pe}}{FOV_{ro}} \cdot \frac{N_{ro}}{N_{pe}} \left\{ \begin{array}{c} \sin 2\theta[(a_1^2 - a_0^2)l_x + (a_4^2 - a_3^2)l_y + (a_7^2 - a_6^2)l_z] - \\ 2\cos 2\theta[a_0 a_1 l_x + a_3 a_4 l_y + a_6 a_7 l_z] \end{array} \right\}.$$

$FOV_{ro}$ is a field of view of a blade along the readout gradient direction, and $FOV_{pe}$ is a field of view of a blade along the phase-encoding gradient direction. $N_{pe}$ is a number of lines in a blade. $N_{ro}$ is a number of samplings along the readout direction of a blade (i.e., along each line of the blade). The method advantageously includes displaying an image generated based on at least one of the constant phase error $c_\theta$, the linear phase error $l_\theta$, and the oblique phase error $o_\theta$.

In a second aspect, a method is disclosed that includes determining a constant phase error $c_x$ associated with a first axis and a linear phase error $l_x$ along the first axis, based on a first reference scan of an object in a magnetic resonance imaging (MRI) system. The first reference scan is acquired using a first reference readout gradient along the first axis. The method further includes determining a constant phase error $c_y$ associated with a second axis and a linear phase error $l_y$ along the second axis, based on a second reference scan on the object. The second reference scan is acquired using a second reference readout gradient along the second axis. The second axis is orthogonal to the first axis. The method further includes determining a constant phase error $c_z$ associated with a third axis and a linear phase error $l_z$ along the third axis, based on a third reference scan on the object. The third reference scan is acquired using a third reference readout gradient along the third axis. The third axis is orthogonal to the second axis and the first axis. The method includes receiving a plurality of intersecting blades about the center of k-space, the plurality of blades being in the same imaging plane in k-space, wherein each of the plurality of intersecting blades is offset from the first axis by a respective blade angle $\theta$. The imaging plane is defined by a rotation matrix A given by:

$$A = \begin{bmatrix} a_0 & a_1 & a_2 \\ a_3 & a_4 & a_5 \\ a_6 & a_7 & a_8 \end{bmatrix}.$$

The method includes, for each of the plurality of intersecting blades, determining a constant phase error $c_\theta$, a linear phase error $l_\theta$, and an oblique phase error $o_\theta$. The constant phase error $c_\theta$ is given by:

$c_\theta = (a_0 \cos\theta + a_1 \sin\theta)c_x + (a_3 \cos\theta + a_4 \sin\theta)c_y + (a_6 \cos\theta + a_7 \sin\theta)c_z.$ The linear phase error $l_\theta$ is given by:

$l_\theta = (a_0 \cos\theta + a_1 \sin\theta)^2 l_x + (a_3 \cos\theta + a_4 \sin\theta)^2 l_y + (a_6 \cos\theta + a_7 \sin\theta)^2 l_z.$ The oblique phase error $o_\theta$ is given by:

$$o_\theta = \frac{FOV_{pe}}{FOV_{ro}} \cdot \frac{N_{ro}}{N_{pe}} \left\{ \begin{array}{c} \sin 2\theta[(a_1^2 - a_0^2)l_x + (a_4^2 - a_3^2)l_y + (a_7^2 - a_6^2)l_z] - \\ 2\cos 2\theta[a_0 a_1 l_x + a_3 a_4 l_y + a_6 a_7 l_z] \end{array} \right\}.$$

$FOV_{ro}$ is a field of view of a blade along the readout gradient direction, and $FOV_{pe}$ is a field of view of a blade along the phase-encoding gradient direction. $N_{pe}$ is a number of lines in a blade. $N_{ro}$ is a number of samplings along the readout direction of a blade (i.e., along each line of the blade). The method includes displaying an image generated based on at least one of the constant phase error $c_\theta$, the linear phase error $l_\theta$, and the oblique phase error $o_\theta$.

In a third aspect, a method is disclosed that includes determining a constant phase error $c_x$ associated with a first axis and a linear phase error $l_x$ along the first axis, based on a first reference scan of an object in an MRI system. The first reference scan is acquired using a first reference readout gradient along the first axis. The method further includes determining a constant phase error $c_y$ associated with a second axis and a linear phase error $l_y$ along the second axis, based on a second reference scan of the object. The second reference scan is acquired using a second reference readout gradient along the second axis. The second axis is orthogonal to the first axis. The method includes receiving a plurality of intersecting blades about the center of k-space, the plurality of intersecting blades being within the same imaging plane in k-space, wherein each of the plurality of intersecting blades is offset from the first axis by a respective blade angle $\theta$. For each of the plurality of intersecting blades, the method includes determining a constant phase error $c_\theta$, a linear phase error $l_\theta$, and an oblique phase error $o_\theta$. The constant phase error $c_\theta$ is given by:

$c_\theta = c_x \cos\theta + c_y \sin\theta.$

The linear phase error $l_\theta$ is given by:

$l_\theta = l_x \cos^2\theta + l_y \sin^2\theta.$

The oblique phase error $o_\theta$ is given by:

$$o_\theta = \frac{FOV_{pe}}{FOV_{ro}} \cdot \frac{N_{ro}}{N_{pe}} (l_y - l_x) \sin 2\theta.$$

$FOV_{ro}$ is a field of view of a blade along the readout gradient direction, and $FOV_{pe}$ is a field of view of a blade along the phase-encoding gradient direction. $N_{pe}$ is a number of lines in a blade. $N_{ro}$ is a number of samplings along the readout direction of a blade (i.e., along each line o the blade). The method includes displaying an image generated based on at least one of the constant phase error $c_\theta$, the linear phase error $l_\theta$, and the oblique phase error $o_\theta$.

In a fourth aspect, a method is disclosed that includes acquiring a plurality of reference scans of an object in a magnetic resonance imaging system. Acquiring the plurality of reference scans of the object includes applying a first reference readout gradient along a first axis of a plurality of orthogonal axes, and applying a second reference readout gradient along a second axis of the plurality of orthogonal axes. The method includes, based on the plurality of reference scans, determining a plurality of constant phase errors associated with corresponding axes of the plurality of orthogonal axes and determining a plurality of linear phase errors along corresponding axes of the plurality of orthogonal axes. The method includes acquiring a plurality of intersecting blades about the center of k-space, the plurality of intersecting blades being within the same imaging plane in k-space, wherein each of the plurality of intersecting blades is offset from the first axis by a respective blade angle $\theta$. The imaging plane is defined by a rotation matrix A. For each of the plurality of intersecting blades, the method includes determining a constant phase error $c_\theta$, a linear phase error $l_\theta$, and an oblique phase error $o_\theta$. The constant phase error $c_\theta$ is a function of at least the rotation matrix A, the blade angle $\theta$, and the plurality of constant phase errors associated with the corresponding axes of the plurality of orthogonal axes. The linear phase error $l_\theta$ is a function of at least the rotation matrix A, the blade angle $\theta$, and the plurality of linear phase errors along the corresponding axes of the plurality of orthogonal axes. The oblique phase error $o_\theta$ is a function of at least the rotation matrix A, the blade angle $\theta$, the plurality of linear phase errors along the corresponding axes of the plurality of orthogonal axes, a field of view of a blade along the readout direction, a field of view of the phase-encoding gradient direction of a blade, a number of lines in a blade, and a number of samplings of each line of a blade. The method includes displaying an image generated based on at least one of the constant phase error $c_\theta$, the linear phase error $l_\theta$, and the oblique phase error $o_\theta$.

Specific embodiments of the present invention will become evident from the following more detailed description of certain preferred embodiments and the claims.

BRIEF DESCRIPTION OF THE DRAWINGS

FIGS. 1A-1D illustrate an example of an echo planar imaging pulse sequence (FIG. 1A), an example of k-space data (FIG. 1B), an example of a blade of k-space data (FIG. 1C), and a number of blades of k-space data (FIG. 1D).

FIG. 3 is a block diagram of method in accordance with a second example.

FIG. 4 is a block diagram of a method in accordance with a third example.

FIGS. 7A-7D illustrate phantom imaging results in accordance with an example of a procedure.

DETAILED DESCRIPTION

Figure 1C:
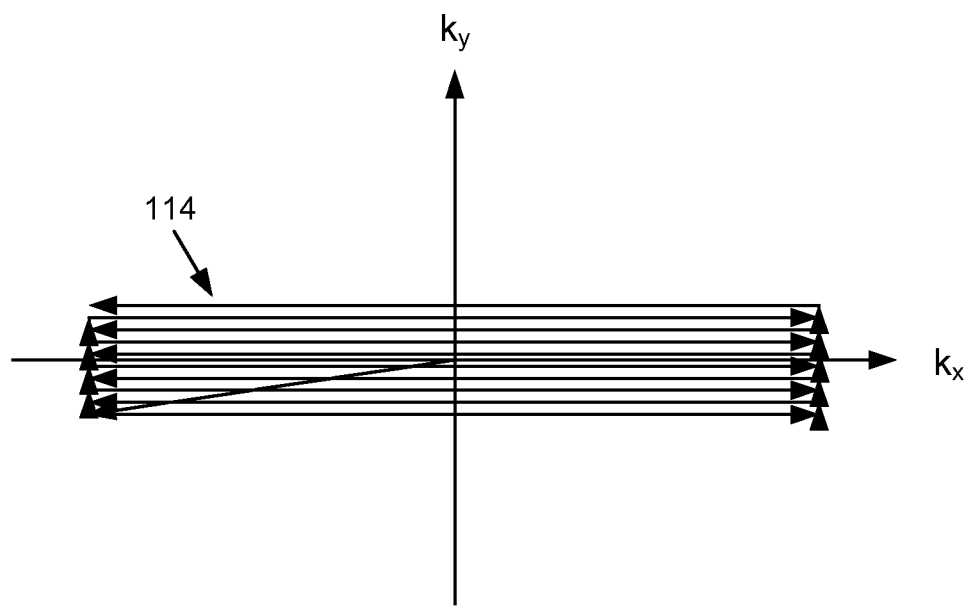

Disclosed embodiments are applicable in connection with an MRI system. An MRI system typically includes a magnet that produces a strong magnetic field, several gradient coils that are positioned about a bore of the magnet to encode spatial information and/or image contrast into magnetic resonance (MR) signals, an RF transceiver system, and a data acquisition sub-system to acquire MR signal data. An MRI system typically also includes, or is in communication with, a computing device that is programmed to cause the MRI system to perform various functions including inter alia applying to an object in the system various RF pulses, magnetic fields, and magnetic field gradients for inducing spin excitations in the object; acquiring MR signal data from the object; processing the MR signal data; and constructing an MR image of the object from the processed MR signal data. The computing device can include one or more general or special purpose processors, one or more forms of memory, and one or more hardware and/or software interfaces for interacting with and/or controlling one or more hardware components of the MRI system.

MR signal data detected from an object are typically described in mathematical terms as "k-space" data. k-Space can generally be considered the Fourier inverse of image space, in which the processed and reconstructed data can be represented as a viewable MR image. MR signal data can be acquired by traversing k-space while applying to the object various RF pulses, magnetic fields, and magnetic field gradients that can cause the object to emit detectable MR signals. In practice, techniques for acquiring MR signal data from an object are closely related to techniques for applying the various RF pulses and magnetic field gradients to the object. Some disclosed embodiments relate to determining constant, linear, and oblique phase errors in k-space data. Further, some disclosed embodiments can be implemented in the form of one or more computer programs or applications that, when executed by a computing device, cause the computing device and/or MRI system to determine constant, linear, and oblique phase errors in k-space data.

Some disclosed embodiments can be used with k-space data acquired using the EPI-PROPELLER technique. An advantage of at least some of the disclosed embodiments is that not only constant and linear, but also oblique phase errors can be determined for k-space data acquired using the EPI-PROPELLER technique. This is an improvement over conventional phase error correction methods used with the EPI-PROPELLER technique, which typically only determine constant and linear phase errors. Another advantage of the disclosed embodiments is that constant, linear, and oblique phase errors can be determined for each of a plurality of blades of k-space data through the acquisition of two or three reference scans. This is an improvement over conventional phase error correction methods, which acquire a number of reference scans that is equal to the number of blades. Accordingly, at least some of the disclosed embodiments can improve efficiency of the MRI system.

1. Example of a Technique

The EPI-PROPELLER technique can be used to acquire a plurality of intersecting blades of k-space data, centered around the origin of k-space. The intersecting blades can lie in an arbitrary imaging plane. The imaging plane can be defined by a rotation matrix A, which relates the coordinates in an image to the coordinates of an MRI system with z-axes typically chosen as the direction of the main magnetic field $B_0$. The axes corresponding to the coordinates of an image are referred to in this disclosure as logical axes, and the axes defining the coordinates of an MRI system are referred to in this disclosure as physical axes. A rotation matrix, which relates the logical axes to the physical axes, can be expressed as follows:

$$A = \begin{bmatrix} a_0 & a_1 & a_2 \\ a_3 & a_4 & a_5 \\ a_6 & a_7 & a_8 \end{bmatrix}. \quad [1]$$

The rotation matrix A, in general, describes a rotation in three-dimensional space. The values of the rotation matrix elements ($a_0$, $a_1$, $a_2$, $a_3$, $a_4$, $a_5$, $a_6$, $a_7$, and $a_8$) range from $-1$ to $1$. In some cases, all elements of the rotation matrix are 0 or $\pm 1$. These cases indicate that physical gradient axes are not combined to produce each of the three logical gradient axes. This case can be encountered when an imaging plane is normal to one of the physical gradient axes, and the readout and phase-encoding gradient axes correspond to the two remaining physical gradient axes. For example, these implementations can be used when the image plane is one of the planes commonly known as the axial, sagittal, and coronal planes. In some other cases, some of the elements $a_0$, $a_1$, $a_2$, $a_3$, $a_4$, $a_5$, $a_6$, $a_7$, and $a_8$ of the rotation matrix A are 0 or $\pm 1$, but not all of the elements are equal to 0 or $\pm 1$. These cases can be encountered when, for example, two of three physical axes are combined to produce a logical axis, but the third physical axis is not combined. In still some other cases, none of the elements of the rotation matrix A is equal to 0 or $\pm 1$. These implementations can be encountered when, for example, all three physical gradient axes are combined to produce a logical gradient axis.

Figure 1D:
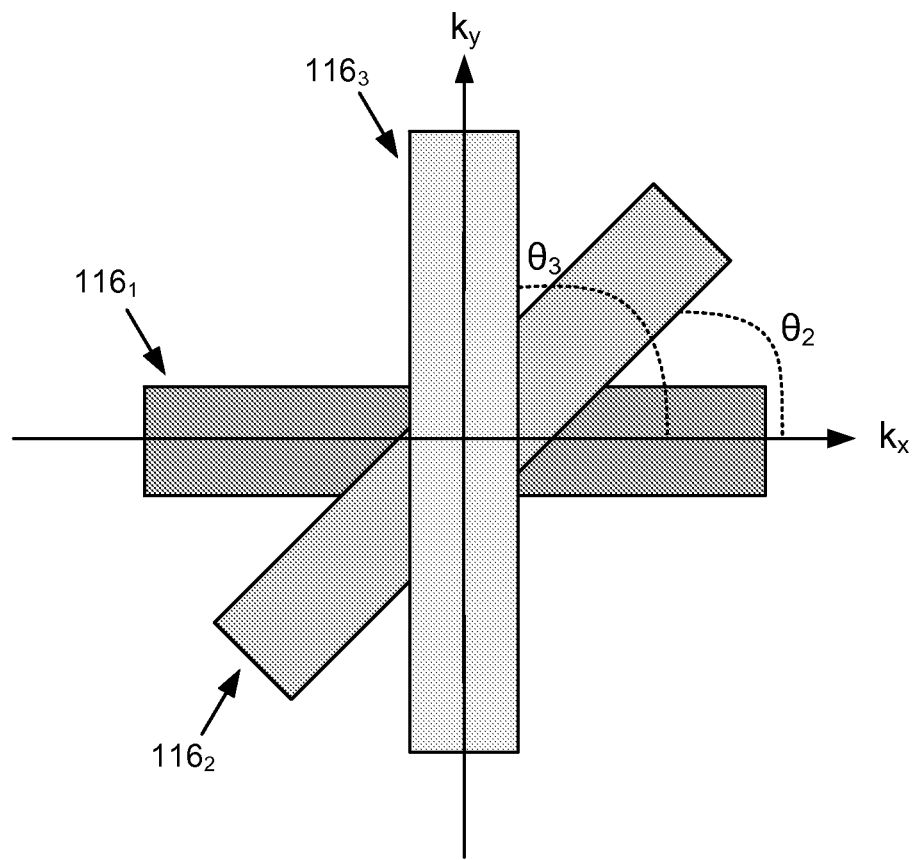

Each of the intersecting blades can be offset from an axis in k-space by a respective angle θ. The axis in k-space can be, for example, the $k_x$ axis shown in FIGS. 1C and 1D, or can be another axis. Further, each of the intersecting blades can be defined by a blade rotation matrix $R_θ$. The blade rotation matrix $R_θ$ can be given by:

$$R_θ = \begin{bmatrix} \cos θ & -\sin θ & 0 \\ \sin θ & \cos θ & 0 \\ 0 & 0 & 1 \end{bmatrix}. \quad [2]$$

In order to acquire each blade, a readout gradient $G_{ro}$ can be applied to an object in an MRI system in the way described above in connection with FIGS. 1A-1D or in a different way. In addition, a phase-encoding gradient $G_{pe}$ and a slice-selecting gradient $G_{sl}$ can be applied to the object, the latter selecting a slice of the object. For a blade with a blade angle $\theta$, the components of the physical gradients for the readout gradient $G_{ro}$ the phase-encoding gradient $G_{pe}$, and the slice-selecting gradient $G_{sl}$ are given by the matrix equation:

$$G_P = AR_\theta G_L \qquad [3]$$

where A and $R_\theta$ are as defined above, and the subscripts "P" and "L" denote physical and logical gradients, respectively, $$G_P = \begin{bmatrix} G_{ro_x} & G_{pe_x} & G_{sl_x} \\ G_{ro_y} & G_{pe_y} & G_{sl_y} \\ G_{ro_z} & G_{pe_z} & G_{sl_z} \end{bmatrix},$$

and $$G_L = \begin{bmatrix} G_{ro} & 0 & 0 \\ 0 & G_{pe} & 0 \\ 0 & 0 & G_{sl} \end{bmatrix}.$$

The matrix equation can be rewritten as the following equation [4]:

$$\begin{bmatrix} G_{ro_x} & G_{pe_x} & G_{sl_x} \\ G_{ro_y} & G_{pe_y} & G_{sl_y} \\ G_{ro_z} & G_{pe_z} & G_{sl_z} \end{bmatrix} = \begin{bmatrix} a_0 & a_1 & a_2 \\ a_3 & a_4 & a_5 \\ a_6 & a_7 & a_8 \end{bmatrix} \begin{bmatrix} \cos\theta & -\sin\theta & 0 \\ \sin\theta & \cos\theta & 0 \\ 0 & 0 & 1 \end{bmatrix} \begin{bmatrix} G_{ro} & 0 & 0 \\ 0 & G_{pe} & 0 \\ 0 & 0 & G_{sl} \end{bmatrix},$$

or, equivalently, as the following equation [5]:

$$\begin{bmatrix} G_{ro_x} & G_{pe_x} & G_{sl_x} \\ G_{ro_y} & G_{pe_y} & G_{sl_y} \\ G_{ro_z} & G_{pe_z} & G_{sl_z} \end{bmatrix} =$$

$$\begin{bmatrix} (a_0\cos\theta + a_1\sin\theta)G_{ro} & (a_1\cos\theta - a_0\sin\theta)G_{pe} & a_2 G_{sl} \\ (a_3\cos\theta + a_4\sin\theta)G_{ro} & (a_4\cos\theta - a_3\sin\theta)G_{pe} & a_5 G_{sl} \\ (a_6\cos\theta + a_7\sin\theta)G_{ro} & (a_7\cos\theta - a_6\sin\theta)G_{pe} & a_8 G_{sl} \end{bmatrix}$$

As described above in connection with FIGS. 1A-1D, the plurality of blades of k-space data acquired using the EPI-PROPELLER technique can suffer from constant and linear phase errors, both of which can arise from eddy currents. Typically, the readout gradient $G_{ro}$ has a much larger amplitude than the phase-encoding gradient $G_{pe}$, so it can typically be assumed that phase errors due to eddy currents are primarily caused by $G_{ro}$. The k-space shifts caused by the linear phase errors along the x-, y-, and z-axes can be expressed according to the following equations:

$$\Delta k'_x = \gamma G_{ro_x} \Delta t_x = \gamma G_{ro}(a_0 \cos\theta + a_1 \sin\theta)\Delta t_x, \qquad [6]$$

$$\Delta k'_y = \gamma G_{ro_y} \Delta t_y = \gamma G_{ro}(a_3 \cos\theta + a_4 \sin\theta)\Delta t_y, \text{ and} \qquad [7]$$

$$\Delta k'_z = \gamma G_{ro_z} \Delta t_z = \gamma G_{ro}(a_6 \cos\theta + a_7 \sin\theta)\Delta t_z, \qquad [8]$$

where $\Delta t_x$, $\Delta t_y$, and $\Delta t_z$ are time shifts of the center of the echoes due to eddy currents along the x-, y-, and z-physical gradient axes, respectively. For an additional discussion on equations [6], [7] and [8], please refer to U.S. Pat. No. 5,672,969 to Zhou et al., titled "Reduction of Nyquist ghost artifacts in oblique echo planar imaging."

Each of the time shifts, $\Delta t_x$, $\Delta t_y$, and $\Delta t_z$, which are generally expressed as $\Delta t$, can be related to the corresponding linear phase error "l" according to the following equation:

$$\Delta t = \frac{N_{ro} l}{2\pi v}, \qquad [9]$$

where $N_{ro}$ is a number of samplings in a direction of the readout gradient and v is a bandwidth of the data sampling.

As noted above, in addition to constant and linear phase errors, the plurality of blades can also suffer from oblique phase errors caused by gradient anisotropy. In particular, gradient anisotropy can cause k-space shifts along the direction of the phase-encoding gradient in an EPI dataset, together with k-space shifts along the direction of the readout gradient. When the oblique phase errors are considered, the k-space shifts can be expressed according to the following equation:

$$\begin{bmatrix} \Delta k'_{ro} \\ \Delta k'_{pe} \\ \Delta k'_{sl} \end{bmatrix} = (AR_\theta)^{-1} \begin{bmatrix} \Delta k'_x \\ \Delta k'_y \\ \Delta k'_z \end{bmatrix} = R_\theta^T A^T \begin{bmatrix} \Delta k'_x \\ \Delta k'_y \\ \Delta k'_z \end{bmatrix}, \qquad [10]$$

which can be expanded to the following equations:

$$\Delta k'_{ro} = \Delta k'_x(a_0 \cos\theta + a_1 \sin\theta) + \Delta k'_y(a_3 \cos\theta + a_4 \sin\theta) + \Delta k'_z(a_6 \cos\theta + a_7 \sin\theta), \text{ and} \qquad [11]$$

$$\Delta k'_{pe} = \Delta k'_x(a_1 \cos\theta - a_0 \sin\theta) + \Delta k'_y(a_4 \cos\theta - a_3 \sin\theta) + \Delta k'_z(a_7 \cos\theta - a_6 \sin\theta). \qquad [12]$$

$\Delta k'_{sl}$ is 0 for orthogonal imaging planes and leads to intra-slice dephasing for oblique planes when gradient anisotropy exists.

Based on equations [6]-[9], [11], and [12], the generalized linear phase errors in the readout and phase-encoding directions for a blade with a blade angle $\theta$ are respectively given by:

$$l_\theta = \frac{(a_0\cos\theta + a_1\sin\theta)^2 l_x + (a_3\cos\theta + a_4\sin\theta)^2 l_y +}{(a_6\cos\theta + a_7\sin\theta)^2 l_z}. \qquad [13]$$

$$o_\theta = \frac{FOV_{pe}}{FOV_{ro}} \cdot \frac{N_{ro}}{N_{pe}} \left\{ \sin 2\theta \begin{bmatrix} (a_1^2 - a_0^2)l_x + \\ (a_4^2 - a_3^2)l_y + \\ (a_7^2 - a_6^2)l_z \end{bmatrix} - 2\cos 2\theta \begin{bmatrix} a_0 a_1 l_x + \\ a_3 a_4 l_y + \\ a_6 a_7 l_z \end{bmatrix} \right\}, \qquad [14]$$

where $FOV_{ro}$ is a field of view of a blade along the readout gradient direction, and $FOV_{pe}$ is a field of view of a blade along the phase-encoding gradient direction. $N_{pe}$ is a number of lines in a blade. $N_{ro}$ is a number of samplings along the readout direction of a blade (i.e., along each line of the blade).

The spatially constant phase error can be produced from the gradient along each of the three physical axes. For a readout gradient that is produced by a combination of its physical gradient components x, y, and z, the corresponding constant phase error can be obtained in a manner analogous to Equations [6]-[8]. The constant phase error for a blade with an angle of θ can be expressed as a scalar sum of the contributions from each of the three physical gradient axes:

$$c_\theta = (a_0 \cos\theta + a_1 \sin\theta)c_x + (a_3 \cos\theta + a_4 \sin\theta)c_y + (a_6 \cos\theta + a_7 \sin\theta)c_z \quad [15]$$

Equations [13], [14], and [15], for linear phase error $l_\theta$, oblique phase error $o_\theta$, and constant phase error $c_\theta$, respectively, can be solved using values acquired in three reference scans. However, when the imaging plan is normal to one of the physical gradient axes, as further explained below, only two reference scan within the imaging plane are needed to compute the phase errors in equations [13]-[15]. Further, equations [13], [14], and [15] can be used to determine phase error values for any blade that is offset by a respective angle from an axis in k-space, such as, for example, the $k_x$ axis shown in FIGS. 1C and 1D. Thus, by acquiring two or three reference scans, the constant phase error $c_\theta$, linear phase error $l_\theta$, and oblique phase error $o_\theta$ for each of a plurality of blades can be determined.

The foregoing description focuses on a plurality of intersecting blades of k-space data that are laid in an arbitrary imaging plane defined by the rotation matrix A. In some embodiments, the imaging plane may not be arbitrary but may instead be normal to one of the physical gradient axes. For example, the image plane can be one of the planes commonly known as the axial, sagittal, and coronal planes. In these embodiments, the rotation matrix A can be considerably simplified. In particular, a number of values in the rotation matrix can be given by 0 and 1. For example, $a_0=1$, $a_1=0$, $a_2=0$, $a_3=0$, $a_4=1$, $a_5=0$, $a_6=0$, $a_7=0$, and $a_8=1$. This, in turn, simplifies the expressions for constant phase error $c_\theta$, linear phase error $l_\theta$, and oblique phase error $o_\theta$. In particular, in these embodiments, the constant phase error $c_\theta$ is given by:

$$c_\theta = c_x \cos\theta + c_y \sin\theta. \quad [16]$$

The linear phase error $l_\theta$ is given by:

$$l_\theta = l_x \cos^2\theta + l_y \sin^2\theta. \quad [17]$$

The oblique phase error $o_\theta$ is given by:

$$o_\theta = \frac{FOV_{pe}}{FOV_{ro}} \cdot \frac{N_{ro}}{N_{pe}} (l_y - l_x) \sin 2\theta, \quad [18]$$

where $c_x$ and $l_x$ are the constant and linear phase errors measured from the first reference scan with readout gradient applied along the physical x-axis, respectively, and $c_x$ and $l_x$ are the constant and linear phase errors measured from the second reference scan with readout gradient applied along the physical y-axis, respectively. Thus, only two reference scans are needed to calculate the constant, linear, and oblique phase errors $c_\theta$, $l_\theta$, and $o_\theta$, for any blade with a blade angle θ, where θ is the angle between the blade orientation and the physical x-axis.

2. Examples of Methods a. First Example of a Method

Figure 2:
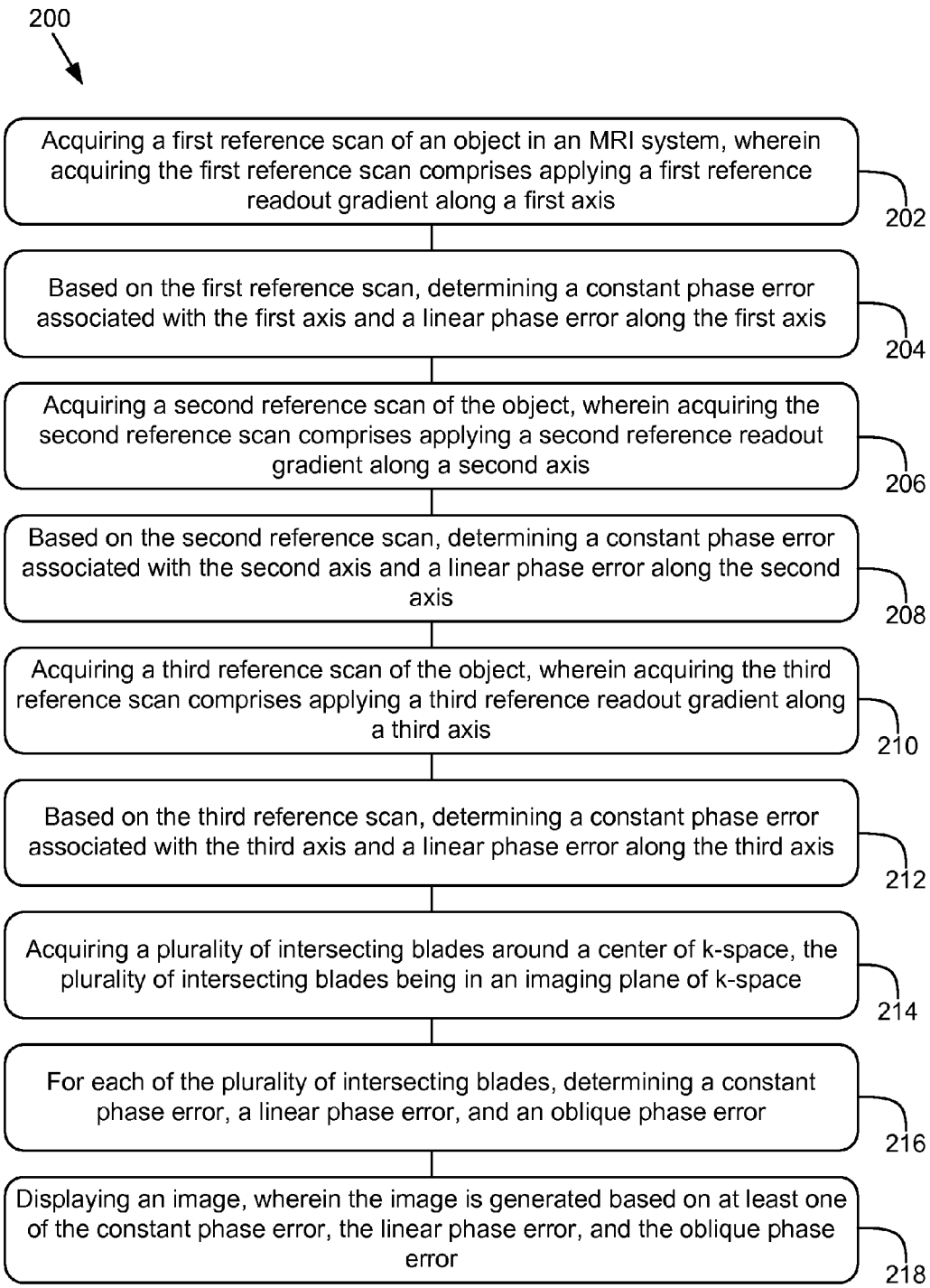
FIG. 2 is a block diagram of a method in accordance with a first example.

FIG. 2 is a block diagram of a method 200, in accordance with an embodiment. The method 200 can, for example, be implemented in an MRI system. Alternatively or additionally, instructions corresponding to the method 200 can be stored on one or more computer programs and/or applications that, when executed by a computing device, cause an MRI system and/or the computing device to implement the method 200.

As shown in FIG. 2, at block 202, the method 200 includes acquiring a first reference scan of an object in an MRI system. Acquiring the first reference scan can involve applying a first reference readout gradient along a first axis, such as, for example, the x-axis. In some embodiments, no phase-encoding gradient can be applied during the first reference scan.

At block 204, the method 200 includes, based on the first reference scan, determining a constant phase error $c_x$ associated with the first axis. Further, at block 204, a linear phase error $l_x$ is determined along the first axis. The constant phase error c, and the linear phase error $l_x$ along the first axis can be determined in a number of manners. In some embodiments, the first reference scan can comprise a number of rows of reference k-space data. For each row of the reference k-space data, a one-dimensional, complex inverse Fourier transform along the first axis can be applied to the row of reference k-space data to produce a set of projections. In a case where no phase inconsistency is present, all of the projections in the set of projections would have the same phase, as no phase-encoding gradient is applied during the first reference scan. Thus, any phase inconsistency can be calculated by comparing phases among the projections. For example, a linear regression of the phase difference (Δϕ) between the odd and even k-space rows can be performed, and a best-fit line of the form $\Delta\phi(x) = c_x + l_x$ can be determined, and the constant phase error $c_x$ associated with the first axis and the linear phase error $l_x$ along the first axis can be determined from the best-fit line. The constant phase error $c_x$ associated with the first axis and the linear phase error $l_x$ along the first axis can be determined in other manners as well.

At block 206, the method 200 includes acquiring a second reference scan of the object. Acquiring the second reference scan can involve applying a second reference readout gradient along a second axis, the second axis being orthogonal to the first axis. The second axis can be, for example, the y-axis. In some embodiments, no phase-encoding gradient can be applied during the second reference scan.

At block 208, the method 200 includes determining a constant phase error $c_y$ associated with the second axis based on the second reference scan. Further, at block 208, a linear phase error $l_y$ along the second axis is determined based on the second reference scan. The constant phase error $c_y$ and the linear phase error $l_y$ along the second axis may be determined in a manner similar to that described above for the constant phase error $c_x$ associated with the first axis and the linear phase error $l_x$ along the first axis.

At block 210, the method 200 includes acquiring a third reference scan of the object. Acquiring the third reference scan can involve applying a third reference readout gradient along a third axis, the third axis being orthogonal to the first axis and the second axis. The third axis can be, for example, the z-axis. In some embodiments, no phase-encoding gradient can be applied during the third reference scan.

At block 212, the method 200 includes determining a constant phase error $c_z$ associated with the third axis based on the third reference scan. Further, at block 212, a linear phase error $l_z$ along the third axis is determined based on the third reference scan. The constant phase error $c_z$ and the linear phase error $l_z$ along the third axis may be determined in a manner similar to that described above for the constant phase error $c_x$ associated with the first axis and the linear phase error $l_x$ along the first axis.

At block 214, the method 200 includes acquiring a plurality of intersecting blades about the center of k-space, the plurality of intersecting blades being within the same imaging plane. The blades can be acquired using, for example, the EPI-PROPELLER technique described above. Further, the imaging plane can be defined by a rotation matrix A, as described above. Still further, each of the plurality of intersecting blades can be offset from the first axis in k-space (for example, the $k_x$-axis) by a respective blade angle $\theta$. The blade angle $\theta$ can be any suitable angle. For example, in the $k_x$-$k_y$ plane discussed above in connection with FIGS. 1B-1D, the blade angle $\theta$ can be an offset that is greater than or equal to 0°. In some implementations, the first blade collected can be rotated relative to the $k_x$ axis, for example. Accordingly, in some implementations, each of the plurality of blades can be offset relative to, for example, the $k_x$ axis by a blade angle that is greater than 0°. These examples are illustrative only; the blade angle $\theta$ can be an angle in various ranges, depending on the desired implementation.

In order to acquire the blades, a blade readout gradient can be applied to the object. The blade readout gradient can have a field of view $FOV_{ro}$. Further, a phase-encoding gradient can be applied to the object. The phase-encoding gradient can have a field of view $FOV_{pe}$.

Each blade can be made up of a number $N_{pe}$ of lines in a direction of the phase-encoding gradient and a number $N_{ro}$ of samplings in a direction of the applied blade readout gradient along the number $N_{pe}$ of lines. In some embodiments, $N_{pe}$ can be greater than $N_{ro}$. In these embodiments, the EPI-PROPELLER technique can utilize short-axis readout PROPELLER (SAP) EPI. In some embodiments, $N_{pe}$ can be less than $N_{ro}$. In these embodiments, the EPI-PROPELLER technique can utilize long-axis readout PROPELLER (LAP) EPI.

At block 216, the method 200 includes determining a constant phase error $c_\theta$, a linear phase error $l_\theta$, and an oblique phase error $o_\theta$ for each of the plurality of intersecting blades. For a respective blade, the constant phase error $c_\theta$ can be given by the following equation:

$$c_\theta(a_0 \cos\theta + a_1 \sin\theta)c_x + (a_3 \cos\theta + a_4 \sin\theta)c_y + (a_6 \cos\theta + a_7 \sin\theta)c_z \quad [19]$$

The linear phase error $l_\theta$ can be given by the following equation:

$$l_\theta = (a_0 \cos\theta + a_1 \sin\theta)^2 l_x + (a_3 \cos\theta + a_4 \sin\theta)^2 l_y + (a_6 \cos\theta + a_7 \sin\theta)^2 l_z \quad [20]$$

The oblique phase error $o_\theta$ can be given by the following equation:

$$o_\theta = \frac{FOV_{pe}}{FOV_{ro}} \cdot \frac{N_{ro}}{N_{pe}} \left\{ \sin 2\theta \begin{bmatrix} (a_1^2 - a_0^2)l_x + \\ (a_4^2 - a_3^2)l_y + \\ (a_7^2 - a_6^2)l_z \end{bmatrix} - 2\cos 2\theta \begin{bmatrix} a_0 a_1 l_x + \\ a_3 a_4 l_y + \\ a_6 a_7 l_z \end{bmatrix} \right\}. \quad [21]$$

At block 218, the method 200 includes displaying an image. For example, displaying the image can include displaying an MR image on a display. The image need not be a final or complete MR image. In some implementations, the image can serve as a preview so that further adjustments can be made, for example, to the MRI system in order to obtain a final image. In some implementations, the image can be generated based on at least one of the constant phase error $c_\theta$, the linear phase error $l_\theta$, and the oblique phase error $o_\theta$. In some implementations, the image can be generated based on all or any informative combinations of the constant phase error $c_\theta$, the linear phase error $l_\theta$, and the oblique phase error $o_\theta$. The image can be an MR image that shows, for example, an aspect of the object in the MRI system along the image plane. The image can be in various formats that are commonly known in the art.

For example, the image can be an image in which the constant phase error $c_\theta$ and the linear phase error $l_\theta$ are corrected. To this end, the constant phase error $c_\theta$ and the linear phase error $l_\theta$ can be corrected for each of the plurality of intersecting blades.

In order to correct the constant phase error $c_\theta$ and the linear phase error $l_\theta$ for a given blade, a one-dimensional inverse Fourier transform can be applied to the k-space data of the blade in the direction of the blade readout gradient, thereby producing hybrid time—k-space data $P_\theta(x, k_y)$. For each sampling n in the number $N_{ro}$ of samplings, a hybrid time—k-space constant and linear phase-corrected sampling $Q_\theta(x_n, k_y)$ can be determined. $Q_\theta(x_n, k_y)$ can be given by the following equation:

$$Q_\theta(x_n, k_y) = P_\theta(x_n, k_y) e^{i(c_\theta + nl_\theta)}. \quad [22]$$

Further, a one-dimensional Fourier transform can be applied to the hybrid time—k-space data $Q_\theta(x, k_y)$ after the constant and linear phase correction to produce a k-space constant and linear phase-corrected blade $q_\theta(k_x, k_y)$. The image can be generated using the k-space constant and linear phase-corrected blades $q(k_x, k_y)$.

Alternatively or additionally, the image can be an image in which the oblique phase error cm is corrected. For example, in embodiments where the oblique phase error $o_\theta$ is corrected in addition to the constant phase error $c_\theta$ and the linear phase error $l_\theta$, the k-space constant and linear phase-corrected blade $q_\theta(k_x, k_y)$ can be separated into a first subset of k-space data $q_{o\theta}(k_x, k_y)$ and a second subset of k-space data $q_{e\theta}(k_x, k_y)$. The first subset $q_{o\theta}(k_x, k_y)$ can include odd-numbered lines in the number $N_{pe}$ of lines. For example, the odd-numbered lines can be the $1^{st}$ line, the $3^{rd}$ line, the $5^{th}$ line, and so on. The second subset $q_{e\theta}(k_x, k_y)$ can include even-numbered lines in the number $N_{pe}$ of lines. For example, the even-numbered lines can be the $2^{nd}$ line, the $4^{th}$ line, the $6^{th}$ line, and so on.

A one-dimensional inverse Fourier transform can then be applied to the first subset $q_{o\theta}(k_x, k_y)$ in the direction of the phase-encoding gradient to produce first hybrid k-space—time data $Q_{o\theta}(k_x, y)$. Then, for each line m in the first subset $q_{o\theta}(k_x, k_y)$, a hybrid time—k-space constant, linear, and oblique phase-corrected line $H_{o\theta}(k_x, y_m)$ can be determined. The hybrid time—k-space constant, linear, and oblique phase-corrected line $H_{o\theta}(k_x, y_m)$ can be given by the following equation:

$$H_{o\theta}(k_x, y_m) = Q_{o\theta}(k_x, y_m) e^{i m o_\theta/2}. \quad [23]$$

A one-dimensional Fourier transform can then be applied to the hybrid time—k-space constant, linear, and oblique phase-corrected blade $H_{o\theta}(k_x, y_m)$ in the direction of the phase-encoding gradient to produce a k-space constant, linear, and oblique phase-corrected blade $h_{o\theta}(k_x, k_y)$.

Similarly, a one-dimensional inverse Fourier transform in the direction of the phase-encoding gradient can be applied to the second subset $q_{e\theta}(k_x, k_y)$ to produce hybrid k-space—time data $Q_{e\theta}(k_x, y)$. For each line m in the second subset $q_{e\theta}(k_x, k_y)$, a hybrid time—k-space constant, linear, and oblique phase-corrected value $H_{e\theta}(k_x, y_m)$ can be determined. The hybrid time—k-space constant, linear, and oblique phase-corrected value $H_{e\theta}(k_x, y_m)$ can be given by the following equation:

$$H_{e\theta}(k_x,y_m)=Q_{e\theta}(k_x,y_m)e^{-im o\theta/2}. \quad [24]$$

A one-dimensional Fourier transform to the hybrid time—k-space constant, linear, and oblique phase-corrected blade $H_{e\theta}(k_x, y_m)$ can be applied in the direction of the phase-encoding gradient to produce a k-space constant, linear, and oblique phase-corrected blade $h_{e\theta}(k_x, k_y)$.

The k-space constant, linear, and oblique phase-corrected blade $h_{o\theta}(k_x, k_y)$ and the k-space constant, linear, and oblique phase-corrected blade $h_{e\theta}(k_x, k_y)$ can then be merged to produce a k-space constant, linear, and oblique phase-corrected blade $h_\theta(k_x, k_y)$. The image can be generated using the k-space constant and linear phase-corrected blades $h(k_x, k_y)$.

b. Second Example of a Method

FIG. 3 is a block diagram of a method 300, in accordance with an embodiment. The method 300 can, for example, be implemented using an MRI system. Alternatively or additionally, instructions corresponding to the method 300 can be stored on one or more computer programs or applications that, when executed by a computing device, cause an MRI system and/or the computing device to implement the method 300.

At block 302, the method 300 includes determining a constant phase error $c_x$ associated with a first axis and a linear phase error $l_x$ along the first axis based on a first reference scan of an object in an MRI system. The constant phase error $c_x$ and the linear phase error $l_x$ along the first axis can be determined in any of the manners described above. The first reference scan can be acquired using a first reference readout gradient along the first axis. In some implementations, an entity, such as, for example, an MRI system, can both perform block 302 of the method 300 and acquire the first reference scan. In some implementations, a first entity, such as, for example, an MRI system, can acquire the first reference scan and provide the first reference scan to a second entity, such as, for example, a computing device. The computing device can then perform block 302 of the method 300.

At block 304, the method 300 includes determining a constant phase error $c_y$ associated with a second axis and a linear phase error $l_y$ along the second axis based on a second reference scan of the object. The constant phase error $c_y$ and the linear phase error $l_y$ along the second axis can be determined in any of the manners described above. The second reference scan can have been acquired using a second reference readout gradient along the second axis. The second axis is orthogonal to the first axis. In some implementations, an entity, such as, for example, an MRI system, can both perform block 304 of the method 300 and acquire the second reference scan. In some implementations, a first entity, such as, for example, an MRI system, can acquire the second reference scan and provide the second reference scan to a second entity, such as, for example, a computing device. The computing device can then perform block 304 of the method 300.

At block 306, the method 300 includes determining a constant phase error $c_z$ and a linear phase error $l_z$ along a third axis based on a third reference scan of the object. The constant phase error $c_z$ associated with the third axis and the linear phase error $l_z$ along the third axis can be determined in any of the manners described above. The third reference scan can have been acquired using a third reference readout gradient along the third axis. The third axis is orthogonal to the first axis and the second axis. In some implementations, an entity, such as, for example, an MRI system, can both perform block 306 of the method 300 and acquire the third reference scan. In some implementations, a first entity, such as, for example, an MRI system, can acquire the third reference scan and provide the third reference scan to a second entity, such as, for example, a computing device. The computing device can then perform block 306 of the method 300.

At block 308, the method 300 includes receiving a plurality of intersecting blades about the center of k-space, the plurality of intersecting blades being within the same imaging plane. The blades can be acquired and/or received using one entity, such as, for example, an MRI system, or using two or more entities, such as, for example, an MRI system and a computing device. The blades can take the forms of the blades described above in connection with FIG. 2, or can take a different form, depending on the desired implementation. In addition, any number of blades can be collected and/or used, depending on the desired implementation.

At block 310, the method 300 includes determining a constant phase error $c_\theta$, a linear phase error $l_\theta$, and an oblique phase error $o_\theta$ for each of the plurality of intersecting blades. At block 312, the method 300 includes displaying an image. The image can be generated based on at least one of the constant phase error $c_\theta$, the linear phase error $l_\theta$, and the oblique phase error $o_\theta$. For example, the image can be displayed using a display device, such as, for example, a monitor or a projection system. Other display devices can be used. The image need not be a final or complete MR image. In some implementations, the image can serve as a preview so that further adjustments can be made, for example, to the MRI system in order to obtain a final image. In some implementations, the image can be generated based on at least one of the constant phase error $c_\theta$, the linear phase error $l_\theta$, and the oblique phase error $o_\theta$. In some implementations, the image can be generated based on a majority, substantially all or all of the constant phase error $c_\theta$, the linear phase error $l_\theta$, and the oblique phase error $o_\theta$. The image can be an MR image that shows, for example, an aspect of the object in the MRI system in the image plane. The image can be of various formats that are commonly known in the art. These examples are illustrative only; the image can take a different form.

The methods 200 and 300 are discussed above in connection with acquiring and/or receiving a first reference scan, a second reference scan, and a third reference scan. In some embodiments, only two reference scans may be acquired and/or received. For example, two reference scans can be acquired and/or received in some embodiments in which the imaging plane is normal to one of the physical gradient axes—such as, for example, where the imaging plane is one of the axial, sagittal, and coronal planes. As described above, in these embodiments, the rotation matrix A can be simplified, which, in turn, can simplify the expressions for constant phase error $c_\theta$, linear phase error $l_\theta$, and oblique phase error $o_\theta$, in many instances eliminating the need for a third reference scan.

c. Third Example of a Method

FIG. 4 is a block diagram of a method 400, in accordance with an embodiment. The method 400 can, for example, be implemented in an MRI system. Alternatively or additionally, instructions corresponding to the method 400 can be stored on one or more computer programs or applications that, when executed by a computing device, cause an MRI system and/or the computing device to implement the method 400.

At block 402, the method 400 includes acquiring a plurality of reference scans of an object in an MRI system. Acquiring the plurality of reference scans of the object can involve applying a first reference readout gradient along a first axis of a plurality of orthogonal axes, and applying a second reference readout gradient along a second axis of the plurality of orthogonal axes. For example, a first reference scan can be acquired by applying a first reference readout gradient along a first axis, and a second reference scan can be acquired by applying a second reference readout gradient along a second axis that is orthogonal to the first axis. Other examples are possible as well.

At block 404, the method 400 includes, based on the plurality of reference scans, determining a plurality of constant phase errors associated with corresponding axes of the plurality of orthogonal axes. Further, at block 404, a plurality of linear phase errors are determined along corresponding axes of the plurality of orthogonal axes. For instance, a constant phase error $c_x$ associated with the first axis, a constant phase error $c_y$ associated with the second axis, a linear phase error $l_x$ along the first axis, and a linear phase error $l_y$ along the second axis can be determined, for example, as discussed above. The constant phase errors and linear phase errors can be determined in any of the manners described above. Other examples are possible as well.

At block 406, the method 400 includes acquiring a plurality of intersecting blades about the center of k-space, the plurality of intersecting blades being in the same imaging plane. The blades can take any of the forms described above in connection with FIG. 2 or can take a different form. In addition, any suitable number of blades can be used, depending on the desired implementation. In some embodiments, the imaging plane can be normal to one of the physical gradient axes (i.e., the axial, sagittal, and coronal planes).

At block 408, the method 400 includes determining a constant phase error $c_\theta$, a linear phase error $l_\theta$, and an oblique phase error $o_\theta$ for each of the plurality of intersecting blades.

The constant phase error $c_\theta$ can be a function of at least a rotation matrix A, the blade angle $\theta$, and the plurality of constant phase errors associated with the corresponding axes of the plurality of orthogonal axes. For example, the constant phase error $c_\theta$ can be given by the following equation:

$$c_\theta (a_0 \cos\theta + a_1 \sin\theta)c_x + (a_3 \cos\theta + a_4 \sin\theta)c_y + (a_6 \cos\theta + a_7 \sin\theta)c_z. \qquad [25]$$

In embodiments in which the imaging plane is normal to one of the physical gradient axes, the constant phase error $c_\theta$ can be given by the following equation:

$$c_\theta = c_x \cos\theta + c_y \sin\theta. \qquad [26]$$

The linear phase error $l_\theta$ can be a function of at least the rotation matrix A, the blade angle $\theta$, and the plurality of linear phase errors along the corresponding axes of the plurality of orthogonal axes. For example, the linear phase error $l_\theta$ can be given by the following equation:

$$l_\theta = (a_0 \cos\theta + a_1 \sin\theta)^2 l_x + (a_3 \cos\theta + a_4 \sin\theta)^2 l_y + (a_6 \cos\theta + a_7 \sin\theta)^2 l_z. \qquad [27]$$

In embodiments in which the imaging plane is normal to one of the physical gradient axes, the linear phase error $l_\theta$ can be given by the following equation:

$$l_\theta = l_x \cos^2\theta + l_y \sin^2\theta. \qquad [28]$$

The oblique phase error $o_\theta$ can be a function of at least the rotation matrix A, the blade angle $\theta$, the plurality of linear phase errors along the corresponding axes of the plurality of orthogonal axes, a field of view along the readout direction, a field of view along the phase-encoding direction, a number of lines in a blade, and a number of samplings in each line of the blade. For example, the oblique phase error $o_\theta$ can be given by the following equation:

$$o_\theta = \frac{FOV_{pe}}{FOV_{ro}} \cdot \frac{N_{ro}}{N_{pe}} \left\{ \sin 2\theta \begin{bmatrix} (a_1^2 - a_0^2)l_x + \\ (a_4^2 - a_3^2)l_y + \\ (a_7^2 - a_6^2)l_z \end{bmatrix} - 2\cos 2\theta \begin{bmatrix} a_0 a_1 l_x + \\ a_3 a_4 l_y + \\ a_6 a_7 l_z \end{bmatrix} \right\}. \qquad [29]$$

In embodiments in which the imaging plane is normal to one of the physical gradient axes, the oblique phase error $o_\theta$ can be given by the following equation:

$$o_\theta = \frac{FOV_{pe}}{FOV_{ro}} \cdot \frac{N_{ro}}{N_{pe}} (l_y - l_x)\sin 2\theta. \qquad [30]$$

At block 410, the method 400 includes displaying an image. The image can be generated based on at least one of the constant phase error $c_\theta$, the linear phase error $l_\theta$, and the oblique phase error $o_\theta$. For example, the image can be displayed using a display device, such as, for example, a monitor or a projection system. Other display devices can be used. The image need not be a final or complete MR image. In some implementations, the image can serve as a preview so that further adjustments can be made, for example, to the MRI system in order to obtain a final image. In some implementations, the image can be generated based on at least one of the constant phase error $c_\theta$, the linear phase error $l_\theta$, and the oblique phase error $o_\theta$. In some implementations, the image can be generated based on a majority, substantially all or all of the constant phase error $c_\theta$, the linear phase error $l_\theta$, and the oblique phase error $o_\theta$. The image can be an MR image that shows, for example, an aspect of the object in the MRI system in the image plane. The image can be of various formats that are commonly known in the art. These examples are illustrative only; the image can take a different form.

3. Example of a Computing Device

Figure 5:
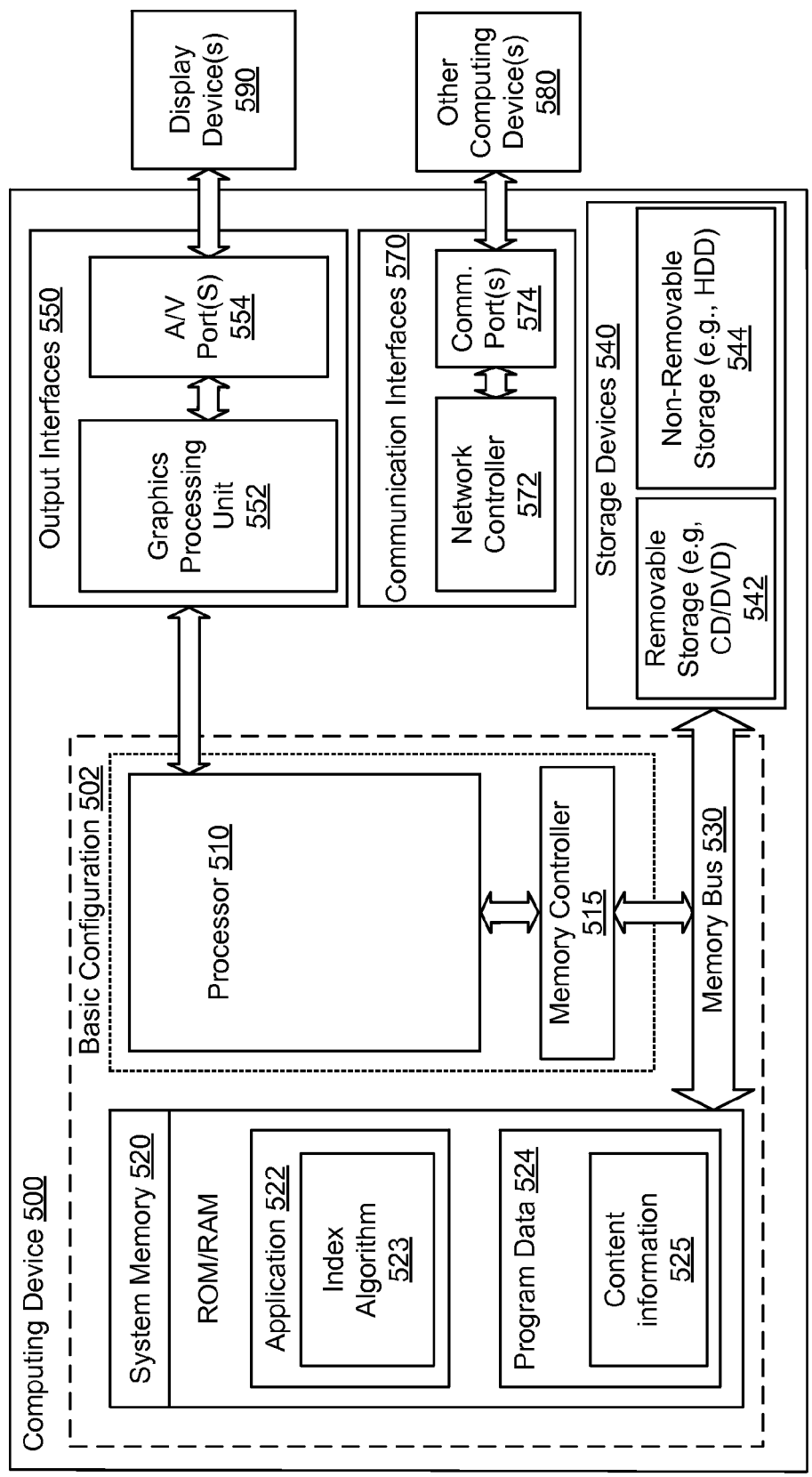
FIG. 5 is a block diagram of a computing device, in accordance with some embodiments.

FIG. 5 is a block diagram illustrating an example of a computing device 500 used in a computing system that is arranged in accordance with some disclosed embodiments. The computing device 500 can be, for example, a personal computer, server, or mobile device. The computing device 500 can be configured to implement any of the disclosed methods, such as, for example, the methods 200, 300, and 400 disclosed above in connection with FIGS. 2, 3, and 4.

In a basic configuration 502, the computing device 500 can include one or more processors 510 and system memory 520. A memory bus 530 can be used for communicating between the processor 510 and the system memory 520. Depending on the desired configuration, the processor 510 can be of any type, including a microprocessor (μP), a microcontroller (μC), a digital signal processor (DSP), or combinations of these. A memory controller 515 can also be used with the processor 510, or in some implementations, the memory controller 515 can be an internal part of the processor 510.

Depending on the desired configuration, the system memory 520 can be of any type, including volatile memory (such as RAM), non-volatile memory (such as ROM, flash memory), and any combination of these. The system memory 520 can include one or more applications 522 and program data 524. The application 522 can include an index algorithm 523 that is arranged to provide inputs to the electronic circuits, in accordance with this disclosure. The program data 524 can include content information 525 that can be directed to any number of types of data. In some embodiments, the application 522 can be arranged to operate with the program data 524 on an operating system.

The computing device 500 can have additional features or functionalities and additional interfaces to facilitate communication between the basic configuration 502 and any devices and interfaces. For example, data storage devices 540 can be provided including removable storage devices 542, non-removable storage devices 544, or a combination of these. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives. Computer storage media can include volatile and nonvolatile, non-transitory, removable and non-removable media implemented in any method or technology for storage of information, such as computer readable instructions, data structures, program modules, or other data.

The system memory 520 and the storage devices 540 are examples of computer storage media. Computer storage media includes, but is not limited to, RAM, ROM, EEPROM, flash memory or other memory technology, CD-ROM, DVDs or other optical storage, magnetic cassettes, magnetic tape, magnetic disk storage or other magnetic storage devices, or any other medium that can be used to store the desired information and that can be accessed by the computing device 500.

The computing device 500 can also include output interfaces 550 that can include a graphics processing unit 552, which can be configured to communicate with various external devices, such as display devices 590 or speakers by way of one or more A/V ports or a communication interface 570. The communication interface 570 can include a network controller 572, which can be arranged to facilitate communication with one or more other computing devices 580 over a network communication by way of one or more communication ports 574. The communication connection is one example of a communication media. Communication media can be embodied by computer-readable instructions, data structures, program modules, or other data in a modulated data signal, such as a carrier wave or other transport mechanism, and includes any information delivery media. A modulated data signal can be a signal that has one or more of its characteristics set or changed in such a manner as to encode information in the signal. By way of example, and not limitation, communication media can include wired media such as a wired network or direct-wired connection, and wireless media such as acoustic, radio frequency (RF), infrared (IR), and other wireless media.

Figure 6:
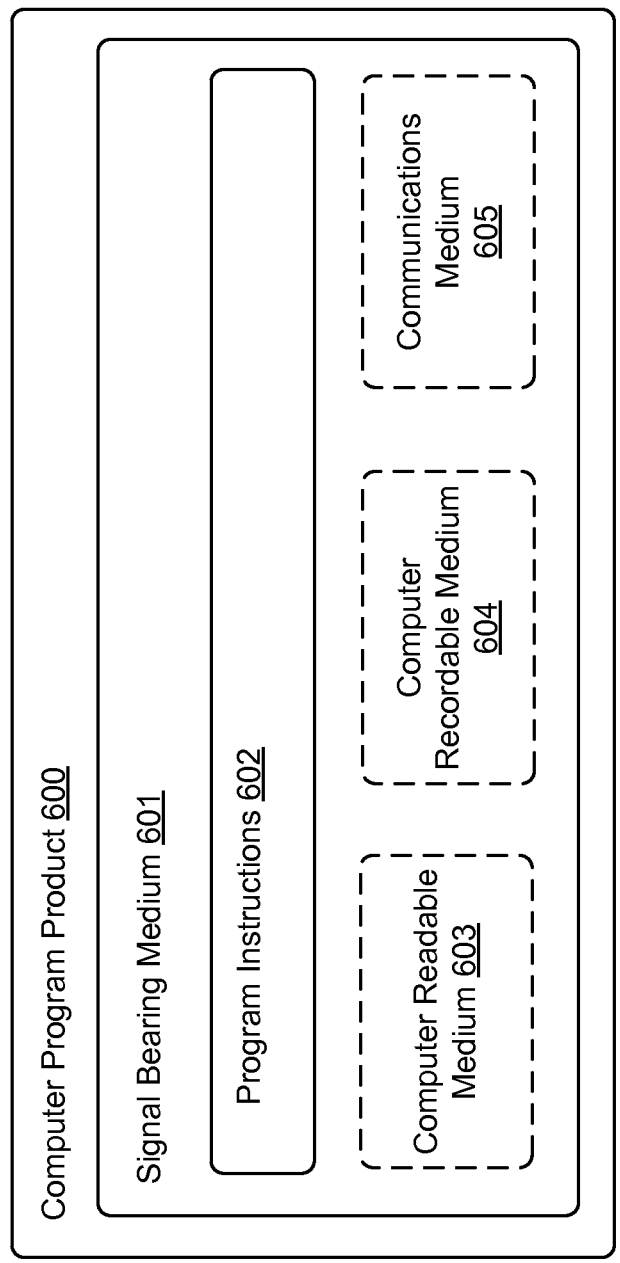
FIG. 6 is a computer program product, in accordance with some embodiments.

In some embodiments, the disclosed methods can be implemented as computer program instructions encoded on a non-transitory computer-readable storage medium in a machine-readable format, or on other non-transitory media or articles of manufacture. FIG. 6 illustrates a conceptual view of a computer program product 600 that includes a computer program for executing a computer process on a computing device, arranged according to some embodiments.

In an embodiment, the computer program product 600 is provided using a signal bearing medium 601. The signal bearing medium 601 can include one or more programming instructions 602 that, when executed by one or more processors, can provide functionality or portions of the functionality described above with respect to FIGS. 2-4. In some examples, the signal bearing medium 601 can encompass a computer-readable medium 603, such as, for example, a hard disk drive, a CD, a DVD, a digital tape, or memory. In some implementations, the signal bearing medium 601 can encompass a computer recordable medium 604, such as, for example, memory, read/write (R/W) CDs, or R/W DVDs. In some implementations, the signal bearing medium 601 can encompass a communications medium 605, such as, for example, a digital or analog communication medium (for example, a fiber optic cable, a waveguide, a wired communications link, or a wireless communication link). Thus, for example, the signal bearing medium 601 can be conveyed by a wireless form of the communications medium 605 (for example, a wireless communications medium conforming to the IEEE 802.11 standard or other transmission protocol).

The one or more programming instructions 602 can be, for example, computer executable or logic implemented instructions. In some examples, a computing device (such as the computing device 500 of FIG. 5) can be configured to provide various operations, functions, or actions in response to the programming instructions 602 conveyed to the computing device 500 by one or more of the computer-readable medium 604, the computer recordable medium 604, and the communications medium 605.

4. Example of Procedure and Results a. Procedure

Evaluation of the phase correction technique was carried out on phantoms and human subjects using a 3.0 T GE Signa HDxt scanner with a transmit-receive quadrature head coil and higher-order shims. The scope of the evaluation included T2-weighted imaging in orthogonal—axial, sagittal, and coronal—and oblique planes, followed by axial diffusion-weighted (DW) scans to demonstrate an application. In each evaluation, short-axis PROPELLER echo planar imaging (SAP-EPI) and/or long-axis PROPELLER echo planar imaging (LAP-EPI) sequences were employed.

To evaluate the performance of the phase correction technique in axial SAP-EPI, two orthogonal reference scans along the x- and y-axes, together with a full set of PROPELLER blades, were acquired from a square phantom, with 6 cm sides, filled with 100% acetone to reduce the dielectric resonance effect at 3.0 T. The data acquisition parameters were as follows: TR=4000 ms, TE=61 ms, bandwidth=±62.5 kHz, blade matrix size=24 readout points×128 phase-encoding steps, number of blades=8, field of view (FOV)=18 cm, and slice thickness=5 mm. A FOV greater than twice the largest dimension of the object was intentionally selected for better assessment of Nyquist ghosts arising from the constant, linear, and/or oblique phase errors. Constant and linear phase errors, computed from Equations [26] and [28], respectively, were used to perform phase correction on each blade (referred to as "Method A"), as described by Equation [22]. For comparison, a full set of reference scans, one for each blade, was also acquired and referred to as "blade-specific" or "blade-by-blade" reference scans. Using this reference scan dataset, constant and linear phase correction was independently performed for each blade (referred to as "Method B"). After correcting for the constant and linear phase errors, the ONG correction was applied using Equations [23], [24], and [30], prior to PROPELLER image reconstruction.

To evaluate the performance of the phase correction technique in axial LAP-EPI, a similar experiment was conducted on the same square phantom with the acquisition parameters given above, except for a transposed blade matrix size with 128 readout points and 24 phase-encoding steps. The same phase correction procedure described above was repeated.

To further demonstrate the performance of the phase correction technique in the presence of local magnetic susceptibility perturbations and with high spatial resolution, SAP- and LAP-EPI data were acquired in multiple axial planes on an American College of Radiology (ACR) phantom with internal structures. Imaging parameters common to both sequences included the following: TR=4000 ms, TE=84 ms, FOV=42 cm, and slice thickness=5 mm. Parameters specific to SAP-EPI were as follows: blade matrix size=24 readout points×256 phase-encoding steps, number of blades=16, and bandwidth=±62.5 kHz. Parameters specific to LAP-EPI included the following: blade matrix size=256 readout points×16 phase-encoding steps, number of blades=24, and bandwidth=±125 kHz. Two orthogonal reference scans were obtained to perform phase corrections.

Validation of the phase correction technique on a sagittal plane was carried out on a uniform spherical phantom (11 cm DSV, 3.3685 g/L $NiCl_2.6H_2O$ and 2.4 g/L NaCl) using the following acquisition parameters for SAP-EPI: TR=4000 ms, TE=55 ms, bandwidth=±62.5 kHz, blade matrix size=24 readout points×128 phase-encoding steps, number of blades=16, FOV=20 cm, and slice thickness=5 mm. A LAP-EPI dataset was also acquired with the same parameters, except for a transposed blade matrix. Two orthogonal reference scans along the y- and z-axes were obtained for phase corrections. After the sagittal scan, additional experiments were carried out in a coronal plane using the same parameters.

Following the phantom validations, the phase correction technique was applied to EPI-PROPELLER images acquired on healthy male volunteers (age: 27-31 years old). First, axial SAP-EPI images were acquired with the following parameters: TR=4000 ms, TE=96 ms, bandwidth=±62.5 kHz, blade matrix size=24 readout points×256 phase-encoding steps, number of blades=16, FOV=28 cm, and slice thickness=5 mm. Second, axial LAP-EPI data were acquired with similar imaging parameters, except for a blade matrix consisting of 256 readout points and 16 phase-encoding steps for each of the 24 blades. Two orthogonal reference scans were acquired for the SAP- and LAP-EPI datasets and used for phase correction. Third, to demonstrate that the phase correction technique can be extended to oblique planes, the aforementioned SAP- and LAP-EPI protocols were repeated (except for a larger FOV of 30 cm) in a plane along the cerebellar tentorium (about 40° rotation from the axial plane). Because all three physical gradient axes were involved in producing the readout gradient, three reference scans were acquired along each of the physical gradient axes, and Equations [25], [27], and [29] were used for phase corrections.

Finally, axial DW SAP- and LAP-EPI images were acquired to further illustrate the performance of the phase correction technique in an application of EPI-PROPELLER. The main data acquisition parameters for DW SAP-EPI were as follows: TR=3000 ms, TE=130 ms, b value=750 $s/mm^2$, diffusion directions=3 (x-, y-, and z-axes), bandwidth=±62.5 kHz, blade matrix size=24 readout points and 256 phase-encoding steps, number of blades=16, FOV=26 cm, and slice thickness=5 mm. Diffusion-weighted LAP-EPI was acquired with the same acquisition parameters, except for a transposed blade matrix. Two reference scans were acquired and phase corrections were carried out as described previously. For comparison, DW single-shot EPI images were also acquired with similar imaging parameters.

The Nyquist ghost intensity was quantitatively evaluated on images reconstructed from each blade of SAP- or LAP-EPI before and after applying the phase corrections. Three regions of interest (ROI), each including about 100 pixels, were selected in (a) a homogeneous region of the object with the highest signal intensity (for example, the ventricle for the human brain images), (b) the background (noise) free from the artifacts, and (c) the background containing the strongest ghost intensity. The ghost intensity ($g_N$) was quantified by the following equation:

$$g_N = \frac{\mu_g - \mu_n}{(\mu_s - \mu_n) + (\mu_g - \mu_n)}, \quad [31]$$

where $\mu_g$, $\mu_s$, and $\mu_n$ are the mean intensities in the Nyquist ghost, the image, and the noise, respectively, in the ROIs described above.

b. Results

Figure 7A:
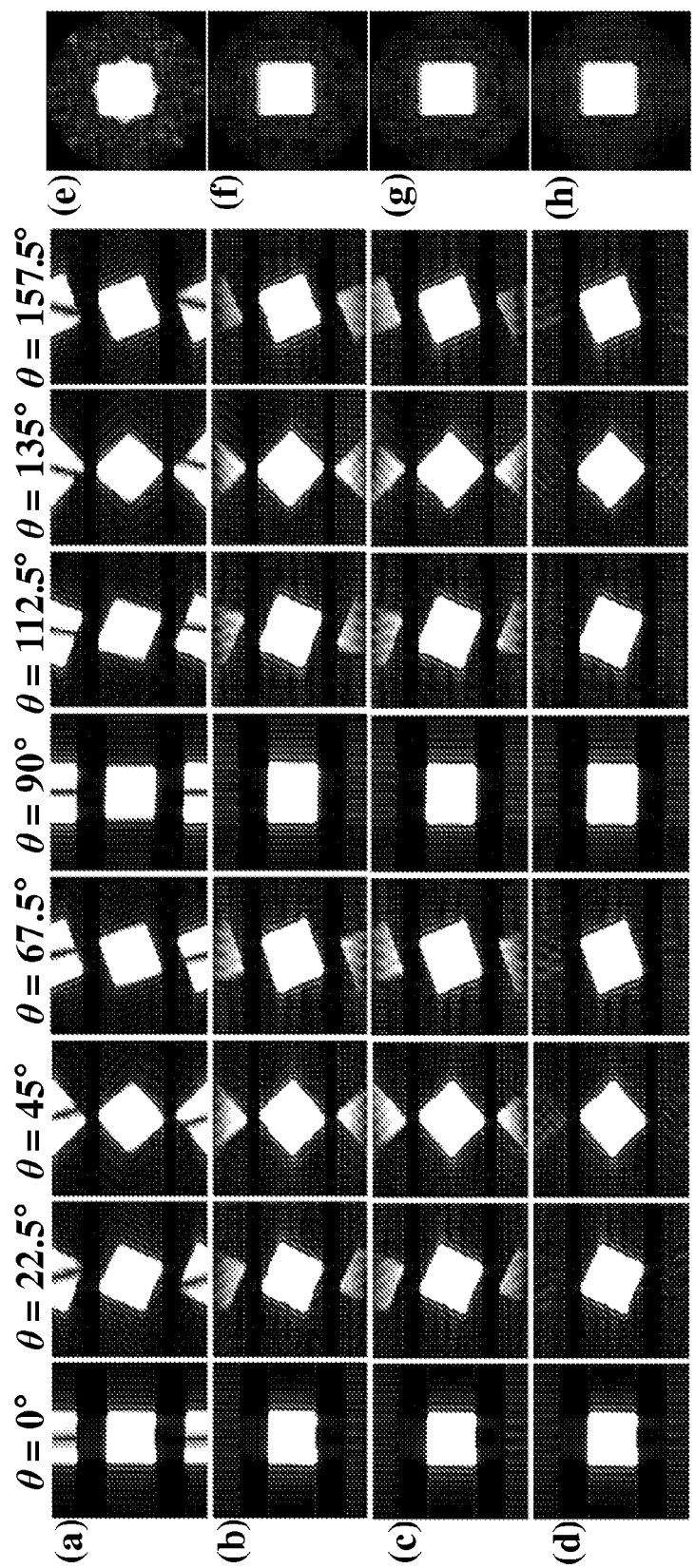

FIG. 7A shows the performance of the phase corrections in axial SAP-EPI on the square phantom. The first row, labeled (a), displays individual images from each blade without any phase correction. The result after correcting the constant and linear phase errors using the technique Method A is shown in the second row, labeled (b). The Nyquist ghosts decreased from an average of 38.2% to 12.7% after the phase correction. The residual Nyquist ghosts were related to the ONG and will be discussed shortly. This technique produced almost identical results to the time-consuming, blade-by-blade reference scan method ("Method B"), as illustrated in the third row, labeled (c), where the average Nyquist ghost intensity was 12.8%. After the oblique phase correction was applied to the images shown in row (b), the Nyquist ghost intensity decreased further to 0.7% for the oblique blades, as shown in the last row, labeled (d). The items labeled (e)-(g) show the PROPELLER images that were reconstructed from the individual blades in the corresponding row. In the PROPELLER image without correction, shown in item (e), the Nyquist ghost artifacts were delocalized and smeared with a reduced intensity, giving a shadow-like "polygon" appearance. After constant and linear phase correction using either Method A, as shown in item (f), or the blade-by-blade Method B, as shown in item (g), the artifacts were reduced. The equivalence of the results in items (f) and (g) indicated that the proposed time-efficient phase correction technique performed at least equally well when compared to the time-consuming method employing considerably more reference scans. The additional ability of Method A for oblique Nyquist ghost correction is illustrated in item (h), where the "ghost" artifacts in the background were essentially eliminated. All images in FIG. 7A were displayed with unconventional window and level settings to highlight the Nyquist ghosts and their reductions.

Similar results were observed from the LAP-EPI dataset, illustrated in FIG. 7B. The LAP-EPI data set was acquired from the same phantom, demonstrating a reduction of the Nyquist ghost from 40.3% before the phase correction, as shown in row (a) of FIG. 7B, to 12.2% after the constant and linear phase correction using Method A, as shown in row (b) of FIG. 7B, and to 12.1% using Method B, as shown in row (c) of FIG. 7B. The Nyquist ghost was reduced to 1.4% after the ONG correction, as shown in row (d) of FIG. 7B. In FIG. 7B, items (e)-(h) display the PROPELLER images for the corresponding rows, where the reduction of the Nyquist ghosts can be visually appreciated with results similar to those discussed in connection with FIG. 7A for SAP-EPI.

Figure 7C:
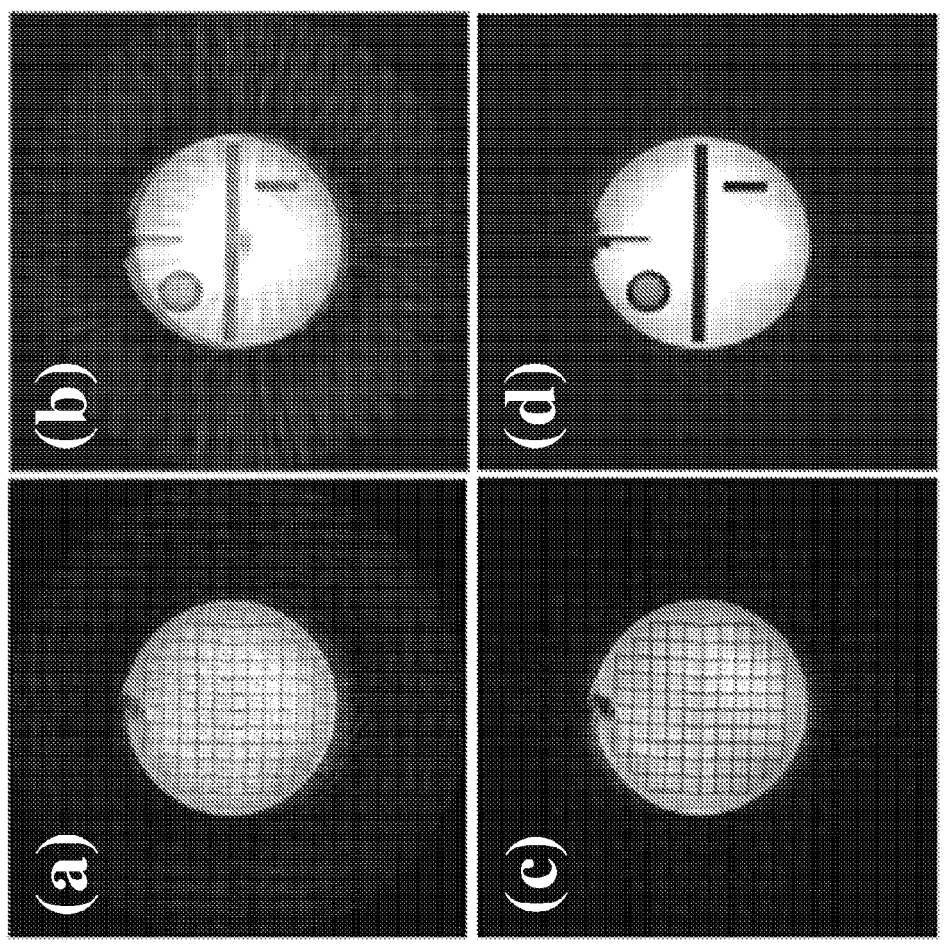

FIG. 7C illustrates the performance of the proposed phase correction technique on the axial images acquired from the ACR phantom using SAP-EPI, as shown in the left column, and using LAP-EPI, as shown in the right column. The images before and after phase corrections are displayed in the upper and lower rows, respectively. After constant, linear, and oblique phase corrections in SAP, the Nyquist ghost decreased from 40.5%, as shown in item (a), to 2.8%, as shown in item (c). After constant, linear, and oblique phase corrections in LAP, the Nyquist ghost decreased from 48.9%, as shown in item (b), to 4.6%, as shown in item (d). The blurring seen at the top of the phantom in items (c) and (d) was caused by the susceptibility differences at the fluid-air interface.

Figure 7D:
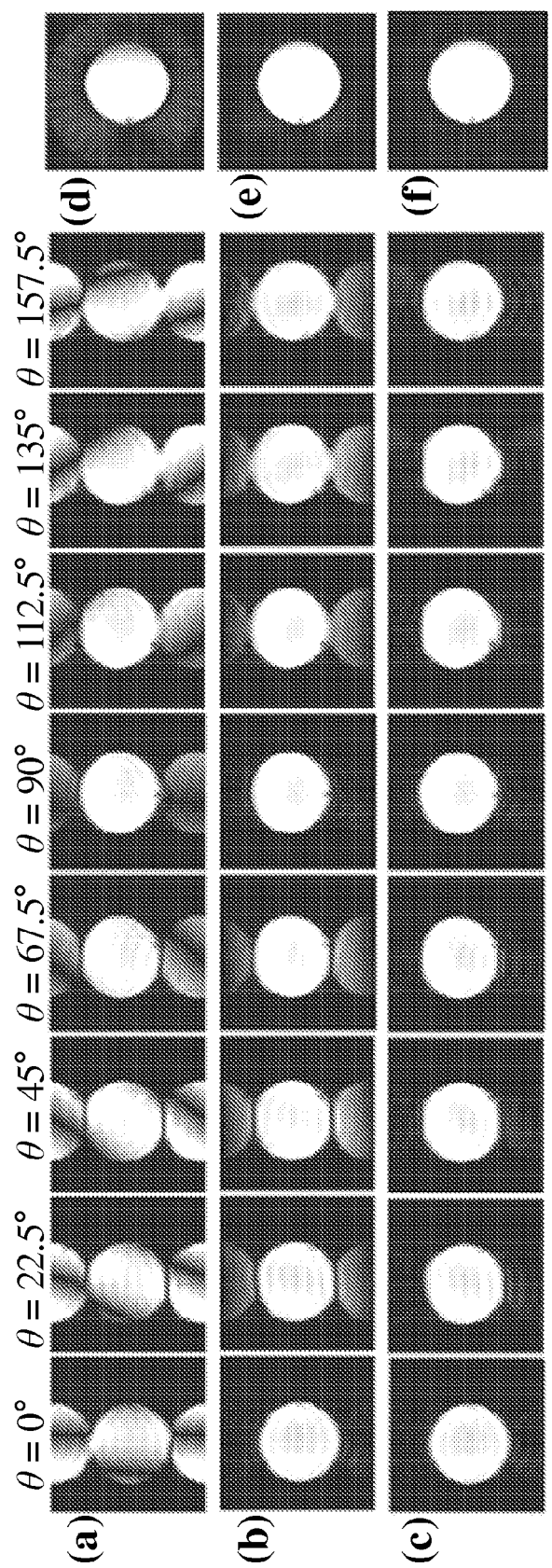

FIG. 7D demonstrates the performance of the proposed phase correction technique in a sagittal plane using the LAP-EPI sequence on the spherical phantom. The Nyquist ghost decreased from 41.3%, as shown in row (a), to 16.7%, as shown in row (b), before and after applying the constant and linear phase correction. The Nyquist ghost further decreased to 3.4%, as shown in row (c), with the oblique phase error correction. EPI-PROPELLER images reconstructed from rows (a)-(c) are shown in items (d)-(f), and exhibited progressively reduced artifacts from item (d) to item (f). Similar results were also obtained for SAP-EPI, where the Nyquist ghost decreased from 21.2% before phase correction to 13.4% after constant and linear phase correction, and to 0.9% with the additional ONG correction (images are not shown). Comparable results were also obtained in the coronal planes for both SAP- and LAP-EPI.

Figure 8A:
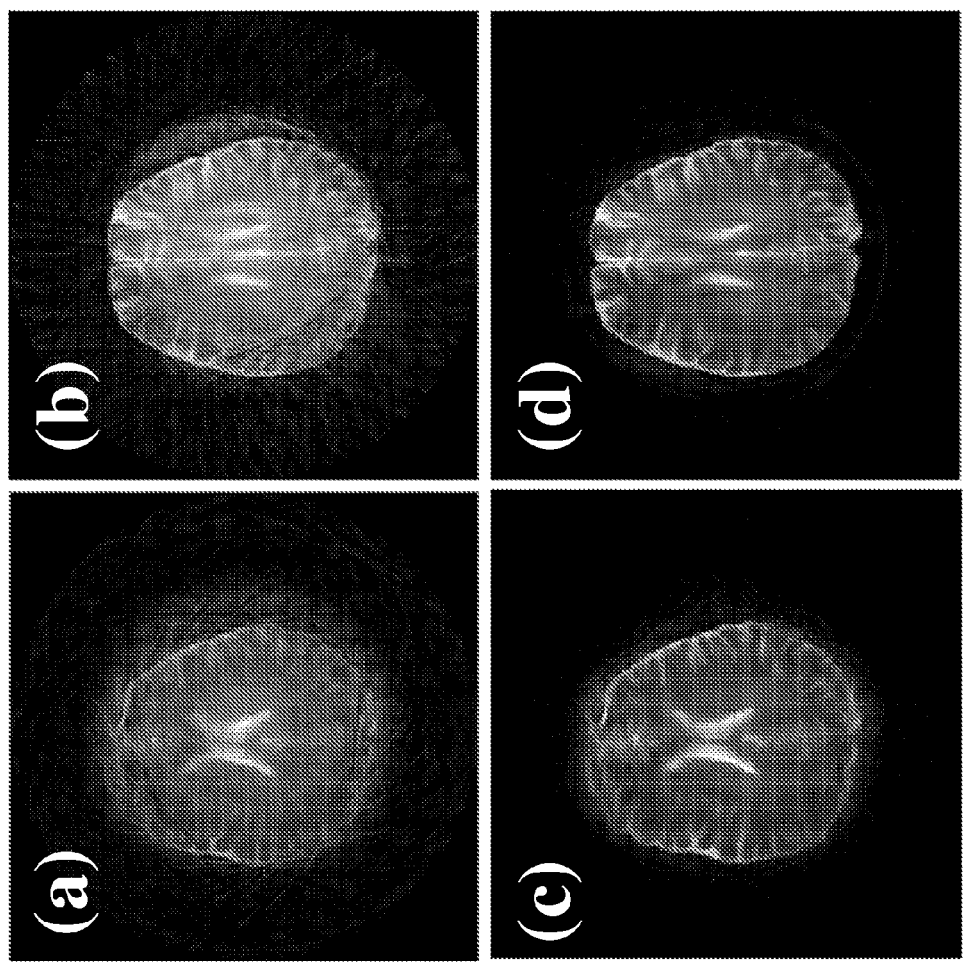
FIGS. 8A-8C illustrate human brain imaging results in accordance with an example of a procedure.
Figure 8B:
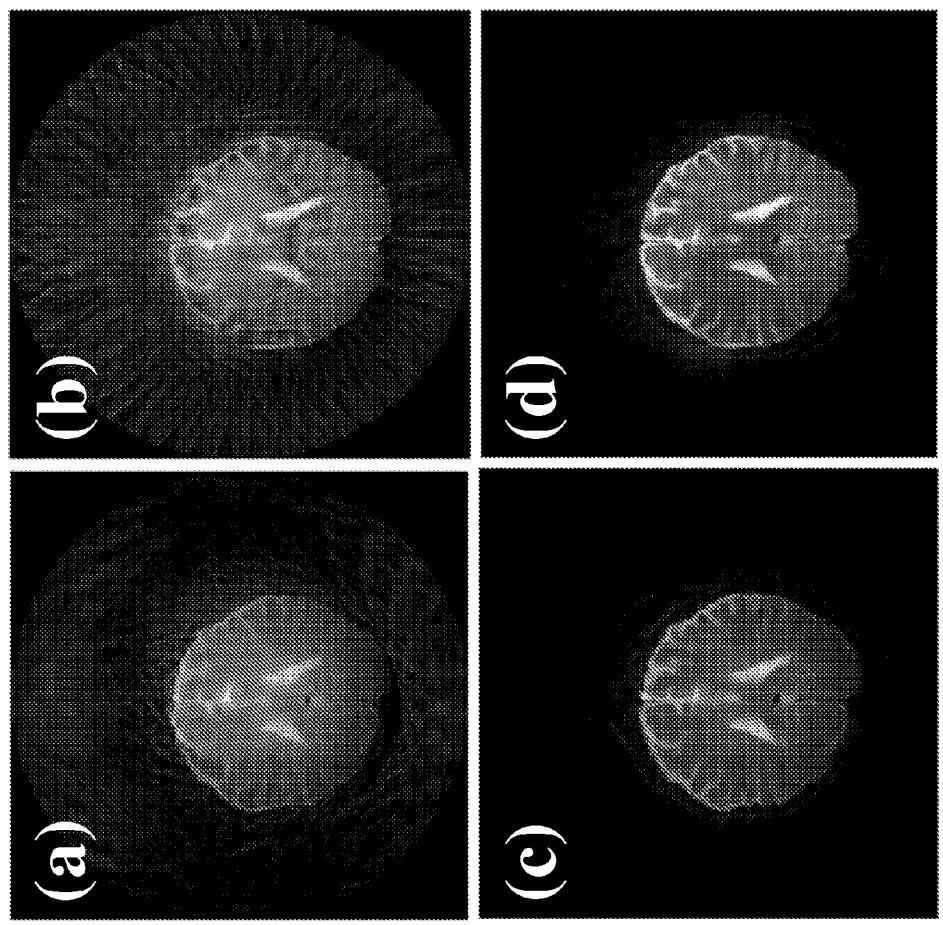
Figure 8C:
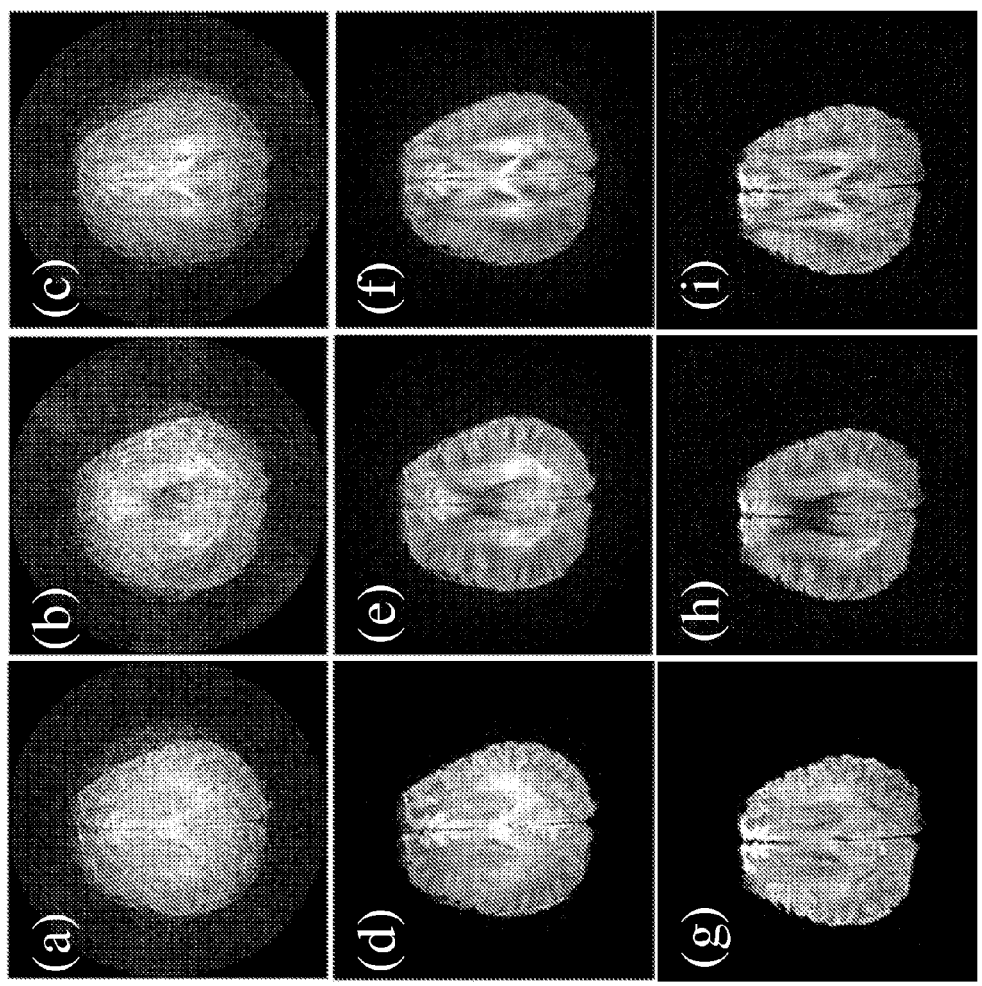

FIGS. 8A-8C illustrate human brain imaging results. FIG. 8A illustrates the performance of the proposed phase correction technique in an axial plane from a representative volunteer. For the individual blades, after applying the proposed correction technique for constant, linear, and oblique phase errors, the Nyquist ghost was reduced from 26.7% to 0.8% in SAP-EPI, as shown in items (a) and (c), and from 38.6% to 4.8% in LAP-EPI, as shown in items (b) and (d). The blurring on the axial SAP-EPI image, shown in item (c), was most likely caused by the susceptibility difference in the frontal sinuses.

FIG. 8B shows the phase correction results in the oblique plane. With three orthogonal reference scans, artifact reduction was achieved both for SAP-EPI, as shown by comparison between items (a) and (c) of FIG. 8B, and for LAP-EPI, as shown by comparison between items (b) and (d) of FIG. 8B. For individual blades, on average the Nyquist ghost decreased from 31.3% to 2.7% in SAP-EPI, and from 36.5% to 5.0% in LAP-EPI. In addition, image uniformity was also improved after the phase corrections, as shown in items (c) and (d). Similar results were obtained in other oblique planes and on other volunteers.

FIG. 8C contains three rows of diffusion-weighted human brain images: non-phase corrected SAP-EPI (first row), phase corrected SAP-EPI (second row), and commercial single-shot EPI images (third row). Each column represents a different diffusion gradient direction. The first column, containing items (a), (d), and (g), corresponds to a superior/inferior direction. The second column, containing items (b), (e), and (h), corresponds to a right/left direction. The third column, containing items (c), (f), and (i), corresponds to an anterior/posterior direction. With phase corrections, the second row images exhibited improvements when compared to their counterparts in the first row. Additionally, the second row images demonstrated reduced image distortion and signal pile up—for example, in the frontal lobe—due to magnetic susceptibility differences when compared to the single-shot DW EPI images in the third row. Similar results were also obtained in DW LAP-EPI (images not shown).

While the foregoing description discusses blades acquired using the EPI-PROPELLER technique, the disclosed embodiments and examples can be applied in connection with any technique in which the readout gradients have components in the physical gradient axes, such as, for example, Turboprop techniques. For a further discussion on Turboprop, please refer to "Turboprop: improved PROPELLER imaging," authored by James G. Pipe et al., published in "Magnetic Resonance in Medicine" at volume 55, issue 2, pages 380-385.

Further, while embodiments and examples are described above, these embodiments and examples are illustrative only, with the true scope and spirit being indicated by the following claims.

What is claimed:
1. A method comprising:
acquiring a first reference scan of an object in a magnetic resonance imaging system, wherein acquiring the first reference scan comprises applying a first reference readout gradient along a first axis;
based on the first reference scan, determining a constant phase error $c_x$ associated with the first axis and a linear phase error $l_x$ along the first axis;
acquiring a second reference scan of the object, wherein acquiring the second reference scan comprises applying a second reference readout gradient along a second axis, the second axis being orthogonal to the first axis;
based on the second reference scan, determining a constant phase error $c_y$ associated with the second axis and a linear phase error $l_y$ along the second axis;
acquiring a third reference scan of the object, wherein acquiring the third reference scan comprises applying a third reference readout gradient along a third axis, the third axis being orthogonal to the first axis and the second axis;
based on the third reference scan, determining a constant phase error $c_z$ associated with the third axis and a linear phase error $l_z$ along the third axis;
acquiring a plurality of intersecting blades around a center of k-space, the plurality of intersecting blades being in an imaging plane of k-space, wherein:
each of the plurality of intersecting blades is offset from the first axis by a respective blade angle θ, and
the imaging plane is defined by a rotation matrix A given by:

$$A = \begin{bmatrix} a_0 & a_1 & a_2 \\ a_3 & a_4 & a_5 \\ a_6 & a_7 & a_8 \end{bmatrix};$$

for each of the plurality of intersecting blades, determining a constant phase error $c_\theta$, a linear phase error $l_\theta$, and an oblique phase error $o_\theta$, wherein:

the constant phase error $c_\theta$ is given by:

$$c_\theta = (a_0\cos\theta + a_1\sin\theta)c_x + (a_3\cos\theta + a_4\sin\theta)c_y + (a_6\cos\theta + a_7\sin\theta)c_z;$$

the linear phase error $l_\theta$ is given by:

$$l_\theta = (a_0\cos\theta + a_1\sin\theta)^2 l_x + (a_3\cos\theta + a_4\sin\theta)^2 l_y + (a_6\cos\theta + a_7\sin\theta)^2 l_z;$$

the oblique phase error is given by:

$$o_\theta = \frac{FOV_{pe}}{FOV_{ro}} \cdot \frac{N_{ro}}{N_{pe}} \{\sin 2\theta[(a_1^2 - a_0^2)l_x + (a_4^2 - a_3^2)l_y + (a_7^2 - a_6^2)l_z] -$$
$$2\cos 2\theta[a_0 a_1 l_x + a_3 a_4 l_y + a_6 a_7 l_z]\},$$

$FOV_{ro}$ is a field of view of an applied blade readout gradient, $FOV_{pe}$ is a field of view of an applied phase-encoding gradient, $N_{pe}$ is a number of lines in a direction of the phase-encoding gradient, and $N_{ro}$ is a number of samplings in a direction of the applied blade readout gradient along the number $N_{pe}$ of lines; and displaying an image, wherein the image is generated based on at least one of the constant phase error $c_\theta$, the linear phase error $l_\theta$, and the oblique phase error $o_\theta$, wherein the method further comprises correcting the constant phase error $c_\theta$ and the linear phase error $l_\theta$ for each of the plurality of intersecting blades, and wherein correcting the constant phase error $c_\theta$ and the linear phase error $l_\theta$ for each of the plurality of intersecting blades comprises:

applying a one-dimensional inverse Fourier transform in the direction of the blade readout gradient to produce hybrid time—k-space data $P_\theta(x, k_y)$;

for each sampling n in the $N_{ro}$ of samplings, determining a hybrid time—k-space constant and linear phase-corrected sampling $Q_\theta(x_n, k_y)$ given by:

$$Q_\theta(x_n, k_y) = P_\theta(x_n, k_y) e^{i(c_\theta + nl_\theta)}; \text{ and}$$

applying a one-dimensional Fourier transform in the direction of the blade readout gradient to produce a k-space constant and linear phase-corrected blade $q_\theta(k_x, k_y)$.

2. The method of claim 1, further comprising correcting the oblique phase error $o_\theta$ for each of the constant and linear phase-corrected blades.

3. The method of claim 2, wherein correcting the oblique phase error $o_\theta$ for each of the constant and linear phase-corrected blades comprises:

separating the constant and linear phase-corrected blade $q_\theta(k_x, k_y)$ into a first subset of k-space data $q_{o\theta}(k_x, k_y)$ and a second subset of k-space data $q_{e\theta}(k_x, k_y)$, wherein the first subset $q_{o\theta}(k_x, k_y)$ includes odd-numbered lines in the number $N_{pe}$ of lines and the second subset $q_{e\theta}(k_x, k_y)$ includes even-numbered lines in the number $N_{pe}$ of lines;

applying a one-dimensional inverse Fourier transform in the direction of the phase-encoding gradient to the first subset $q_{o\theta}(k_x, k_y)$ to produce first hybrid k-space—time data $Q_{o\theta}(k_x, y)$;

for each line m in the first subset $q_{o\theta}(k_x, k_y)$, determining a hybrid time—k-space constant, linear, and oblique phase-corrected line $H_{o\theta}(k_x, y_m)$ given by:

$$H_{o\theta}(k_x, y_m) = Q_{o\theta}(k_x, y_m) e^{imo_\theta/2};$$

applying a one-dimensional Fourier transform in the direction of the phase-encoding gradient to the hybrid time—k-space constant, linear, and oblique phase-corrected blade $H_{o\theta}(k_x, y_m)$ to produce a k-space constant, linear, and oblique phase-corrected blade $h_{o\theta}(k_x, k_y)$;

applying a one-dimensional inverse Fourier transform in the direction of the phase-encoding gradient to the second subset $q_{e\theta}(k_x, k_y)$ to produce hybrid k-space—time data $Q_{e\theta}(k_x, y)$;

for each line m in the second subset $q_{e\theta}(k_x, k_y)$, determining a hybrid time—k-space constant, linear, and oblique phase-corrected value $H_{e\theta}(k_x, y_m)$ given by:

$$H_{e\theta}(k_x, y_m) = Q_{e\theta}(k_x, y_m) e^{-imo_\theta/2};$$

applying a one-dimensional Fourier transform in the direction of the phase-encoding gradient to the hybrid time—k-space constant, linear, and oblique phase-corrected blade $H_{e\theta}(k_x, y_m)$ to produce a k-space constant, linear, and oblique phase-corrected blade $h_{e\theta}(k_x, k_y)$; and merging the k-space constant, linear, and oblique phase-corrected blade $h_{o\theta}(k_x, k_y)$ and the k-space constant, linear, and oblique phase-corrected blade $h_{e\theta}(k_x, k_y)$ to produce a k-space constant, linear, and oblique phase-corrected blade $h_\theta(k_x, k_y)$.

4. The method of claim 3, further comprising generating the image based on the k-space constant, linear, and oblique phase-corrected blades $h_\theta(k_x, k_y)$.

5. The method of claim 1, wherein $N_{ro}$ is greater than or equal to $N_{pe}$.

6. The method of claim 1, wherein $N_{ro}$ is less than $N_{pe}$.

7. A method comprising:

determining a constant phase error $c_x$ associated with a first axis and a linear phase error $l_x$ along the first axis, based on a first reference scan of an object in a magnetic resonance imaging system, the first reference scan being acquired using a first reference readout gradient along the first axis;

determining a constant phase error $c_y$ associated with a second axis and a linear phase error $l_y$ along the second axis, based on a second reference scan of the object, the second reference scan being acquired using a second reference readout gradient along the second axis, the second axis being orthogonal to the first axis;

determining a constant phase error $c_z$ associated with a third axis and a linear phase error $l_z$ along the third axis, based on a third reference scan of the object, the third reference scan being acquired using a third reference readout gradient along the third axis, the third axis being orthogonal to the first axis and the second axis;

receiving a plurality of intersecting blades around a center of k-space, the plurality of intersecting blades being in an imaging plane of k-space, wherein:

each of the plurality of intersecting blades is offset from the first axis by a respective blade angle θ, and the imaging plane is defined by a rotation matrix A given by:

$$A = \begin{bmatrix} a_0 & a_1 & a_2 \\ a_3 & a_4 & a_5 \\ a_6 & a_7 & a_8 \end{bmatrix};$$

for each of the plurality of intersecting blades, determining a constant phase error $c_\theta$, a linear phase error $l_\theta$, and an oblique phase error $o_\theta$, wherein:
the constant phase error $c_\theta$ is given by:

$c_\theta = (a_0 \cos\theta + a_1 \sin\theta)c_x + (a_3 \cos\theta + a_4 \sin\theta)c_y + (a_6 \cos\theta + a_7 \sin\theta)c_z,$ the linear phase error $l_\theta$ is given by:

$l_\theta = (a_0 \cos\theta + a_1 \sin\theta)^2 l_x + (a_3 \cos\theta + a_4 \sin\theta)^2 l_y + (a_6 \cos\theta + a_7 \sin\theta)^2 l_z,$ the oblique phase error $o_\theta$ is given by:

$$o_\theta = \frac{FOV_{pe}}{FOV_{ro}} \cdot \frac{N_{ro}}{N_{pe}} \{\sin 2\theta[(a_1^2 - a_0^2)l_x + (a_4^2 - a_3^2)l_y + (a_7^2 - a_6^2)l_z] - 2\cos 2\theta[a_0 a_1 l_x + a_3 a_4 l_y + a_6 a_7 l_z]\},$$

$FOV_{ro}$ is a field of view of an applied blade readout gradient,
$FOV_{pe}$ is a field of view of an applied phase-encoding gradient,
$N_{pe}$ is a number of lines in a direction of the applied phase-encoding gradient, and
$N_{ro}$ is a number of samplings in a direction of the applied blade readout gradient along the number $N_{pe}$ of lines; and
displaying an image, wherein the image is generated based on at least one of the constant phase error $c_\theta$, the linear phase error $l_\theta$, and the oblique phase error $o_\theta$,
wherein the method further comprises correcting the constant chase error $c_\theta$ and the linear phase error $l_\theta$ for each of the plurality of intersecting blades,
and wherein correcting the constant phase error $c_\theta$ and the linear phase error $l_\theta$ for each of the plurality of intersecting blades comprises:
applying a one-dimensional inverse Fourier transform in the direction of the blade readout gradient to produce hybrid time—k-space data $P_\theta(x, k_y)$;
for each sampling n in the number $N_{ro}$ of sampling, determining a hybrid time—k-space constant and linear phase-corrected sampling $Q_\theta(x_n, k_y)$ given by:

$Q_\theta(x_n, k_y) = P_\theta(x_n, k_y) e^{i(c_\theta + n l_\theta)};$ and applying a one-dimensional Fourier transform in the direction of the blade readout gradient to produce a k-space constant and linear phase-corrected blade $q_\theta(k_x, k_y)$.

8. The method of claim 7, further comprising correcting the oblique phase error $o_\theta$ for each of the constant and linear phase-corrected blades.

9. The method of claim 8, wherein correcting the oblique phase error $o_\theta$ for each of the constant and linear phase-corrected blades comprises:
separating the constant and linear phase-corrected blade $q_\theta(k_x, k_y)$ into a first subset of k-space data $q_{o\theta}(k_x, k_y)$ and a second subset of k-space data $q_{e\theta}(k_x, k_y)$, wherein the first subset $q_{o\theta}(k_x, k_y)$ includes odd-numbered lines in the number $N_{pe}$ of lines and the second subset $q_{e\theta}(k_x, k_y)$ includes even-numbered lines in the number $N_{pe}$ of lines;
applying a one-dimensional inverse Fourier transform in the direction of the phase-encoding gradient to the first subset $q_{o\theta}(k_x, k_y)$ to produce first hybrid k-space—time data $Q_{o\theta}(k_x, y)$;
for each line m in the first subset $q_{o\theta}(k_x, k_y)$, determining a hybrid time—k-space constant, linear, and oblique phase-corrected line $H_{o\theta}(k_x, y_m)$ given by:

$H_{o\theta}(k_x, y_m) = Q_{o\theta}(k_x, y_m) e^{i m o_\theta / 2};$ applying a one-dimensional Fourier transform in the direction of the phase-encoding gradient to the hybrid time—k-space constant, linear, and oblique phase-corrected blade $H_{o\theta}(k_x, y_m)$ to produce a k-space constant, linear, and oblique phase-corrected blade $h_{o\theta}(k_x, k_y)$;
applying a one-dimensional inverse Fourier transform in the direction of the phase-encoding gradient to the second subset $q_{e\theta}(k_x, k_y)$ to produce hybrid k-space—time data $Q_{e\theta}(k_x, y)$;
for each line m in the second subset $q_{e\theta}(k_x, k_y)$, determining a hybrid time—k-space constant, linear, and oblique phase-corrected value $H_\theta(k_x, y_m)$ given by:

$H_{e\theta}(k_x, y_m) = Q_{e\theta}(k_x, y_m) e^{-i m o_\theta / 2};$ applying a one-dimensional Fourier transform in the direction of the phase-encoding gradient to the hybrid time—k-space constant, linear, and oblique phase-corrected blade $H_{e\theta}(k_x, y_m)$ to produce a k-space constant, linear, and oblique phase-corrected blade $h_{e\theta}(k_x, k_y)$; and
merging the k-space constant, linear, and oblique phase-corrected blade $h_{o\theta}(k_x, k_y)$ and the k-space constant, linear, and oblique phase-corrected blade $h_{e\theta}(k_x, k_y)$ to produce a k-space constant, linear, and oblique phase-corrected blade $h_\theta(k_x, k_y)$.

10. The method of claim 9, further comprising generating the image based on the k-space constant, linear, and oblique phase-corrected blades $h_\theta(k_x, k_y)$.

11. The method of claim 7, wherein $N_{ro}$ is greater than or equal to $N_{pe}$.

12. The method of claim 7, wherein $N_{ro}$ is less than $N_{pe}$.

* * * * *